United States Patent
Keller et al.

(10) Patent No.: US 9,773,760 B2
(45) Date of Patent: Sep. 26, 2017

(54) LED PACKAGES AND LUMINAIRES INCORPORATING SAME

(71) Applicant: Cree, Inc., Durham, NC (US)

(72) Inventors: Bernd P. Keller, Santa Barbara, CA (US); Eric J. Tarsa, Goleta, CA (US); Zongjie Yuan, Libertyville, IL (US); Kurt S. Wilcox, Libertyville, IL (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/764,500

(22) PCT Filed: Jan. 30, 2014

(86) PCT No.: PCT/US2014/013931
§ 371 (c)(1),
(2) Date: Jul. 29, 2015

(87) PCT Pub. No.: WO2014/120968
PCT Pub. Date: Aug. 7, 2014

(65) Prior Publication Data
US 2016/0005920 A1 Jan. 7, 2016

Related U.S. Application Data

(63) Continuation-in-part of application No. 13/842,521, filed on Mar. 15, 2013, now Pat. No. 9,519,095.
(Continued)

(51) Int. Cl.
*F21V 1/00* (2006.01)
*F21V 11/00* (2015.01)
(Continued)

(52) U.S. Cl.
CPC ........ *H01L 25/0753* (2013.01); *G02B 6/0021* (2013.01); *G02B 6/0036* (2013.01); *G02B 6/0068* (2013.01); *G02B 6/0073* (2013.01); *F21V 5/04* (2013.01); *F21Y 2105/00* (2013.01); *F21Y 2105/10* (2016.08); *F21Y 2105/12* (2016.08); *F21Y 2113/13* (2016.08); *F21Y 2115/10* (2016.08); *G02B 6/0031* (2013.01); *G02B 6/0051* (2013.01);
(Continued)

(58) Field of Classification Search
CPC ........ H01L 25/0753; H01L 2924/0002; G02B 6/0068; G02B 6/0036; G02B 6/0073; G02B 6/0021; G02B 6/0078; G02B 6/00; F21Y 2105/10; F21Y 2115/10; F21Y 2113/13; F21Y 2105/12; F21Y 2101/00; F21Y 2105/00
See application file for complete search history.

(56) References Cited

U.S. PATENT DOCUMENTS

2003/0206408 A1* 11/2003 Funamoto ............ G02B 6/0036
362/603
2005/0152153 A1* 7/2005 Amano ................. F21S 48/215
362/520
(Continued)

*Primary Examiner* — Donald Raleigh
(74) *Attorney, Agent, or Firm* — McCracken & Gillen LLC

(57) ABSTRACT

According to one aspect, an LED package comprises a plurality of LEDs and a primary optic disposed adjacent the LEDs wherein the primary optic includes protrusions for mixing light developed by the plurality of LEDs.

19 Claims, 24 Drawing Sheets

Related U.S. Application Data which is a continuation-in-part of application No. 13/839,949, filed on Mar. 15, 2013, now Pat. No. 9,581,751, which is a continuation-in-part of application No. 13/841,074, filed on Mar. 15, 2013, now Pat. No. 9,625,638, which is a continuation-in-part of application No. 13/840,563, filed on Mar. 15, 2013, said application No. PCT/US2014/013931 is a continuation-in-part of application No. 13/938,877, filed on Jul. 10, 2013, now Pat. No. 9,389,367, and a continuation-in-part of application No. 14/101,086, filed on Dec. 9, 2013, and a continuation-in-part of application No. 14/101,132, filed on Dec. 9, 2013, now Pat. No. 9,442,243, which is a continuation-in-part of application No. 14/101,147, filed on Dec. 9, 2013, which is a continuation-in-part of application No. 14/101,099, filed on Dec. 9, 2013, now Pat. No. 9,411,086, which is a continuation-in-part of application No. 14/101,129, filed on Dec. 9, 2013, which is a continuation-in-part of application No. 14/101,051, filed on Dec. 9, 2013, now Pat. No. 9,366,396.

(60) Provisional application No. 61/758,660, filed on Jan. 30, 2013, provisional application No. 61/922,017, filed on Dec. 30, 2013.

(51) Int. Cl.

| | | |
|---|---|---|
| *F21V 3/00* | (2015.01) | |
| *F21V 5/00* | (2015.01) | |
| *H01L 25/075* | (2006.01) | |
| *F21V 8/00* | (2006.01) | |
| *H01L 33/58* | (2010.01) | |
| *F21V 5/04* | (2006.01) | |
| *F21Y 105/00* | (2016.01) | |
| *F21Y 105/12* | (2016.01) | |
| *F21Y 105/10* | (2016.01) | |
| *F21Y 115/10* | (2016.01) | |
| *F21Y 113/13* | (2016.01) | |

(52) U.S. Cl.
CPC .......... *G02B 6/0078* (2013.01); *H01L 33/58* (2013.01); *H01L 2924/0002* (2013.01)

(56) References Cited

U.S. PATENT DOCUMENTS

| | | | |
|---|---|---|---|
| 2006/0050200 A1* | 3/2006 | Nagao | G02B 6/0031 349/65 |
| 2008/0217510 A1* | 9/2008 | Greiner | G02B 6/0011 250/205 |
| 2008/0225522 A1* | 9/2008 | Ito | G02B 3/005 362/247 |
| 2009/0162015 A1* | 6/2009 | Meir | G02B 6/0065 385/49 |
| 2011/0044073 A1* | 2/2011 | Gourlay | G02B 6/0043 362/607 |
| 2013/0286684 A1* | 10/2013 | Holman | F21V 17/16 362/612 |
| 2014/0064660 A1* | 3/2014 | Huang | G02B 6/0036 385/31 |
| 2014/0169031 A1* | 6/2014 | Lin | F21V 5/04 362/606 |

* cited by examiner

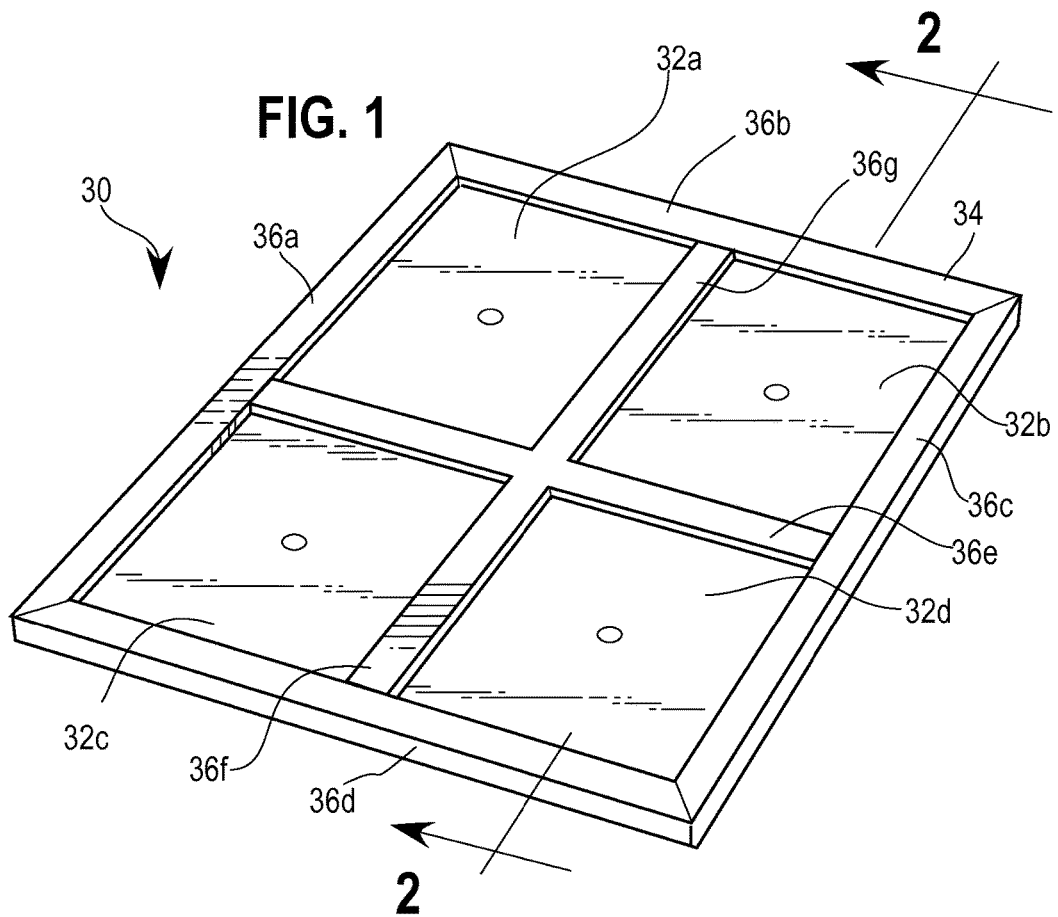

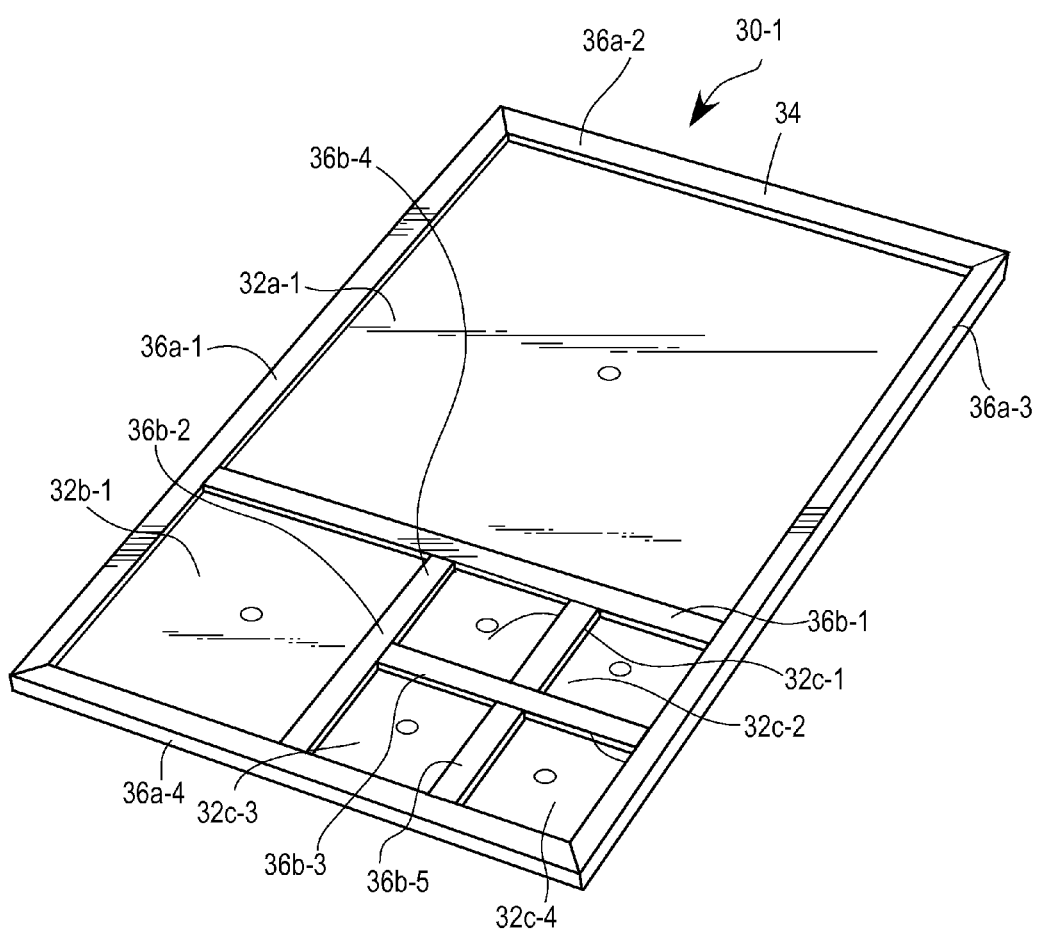

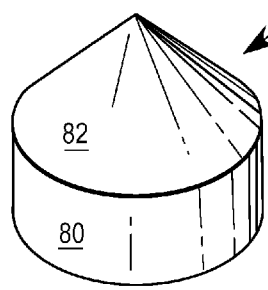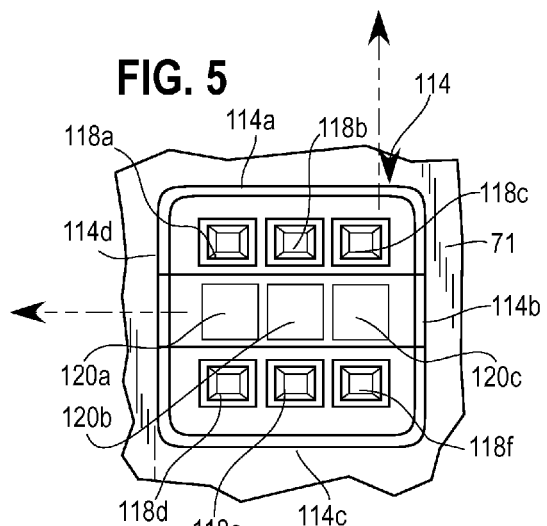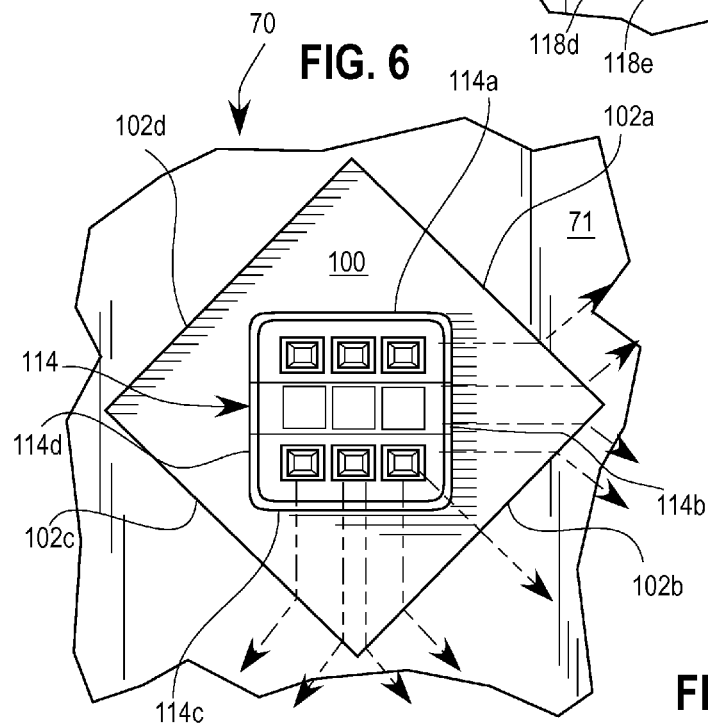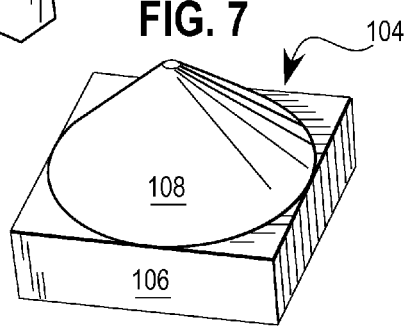

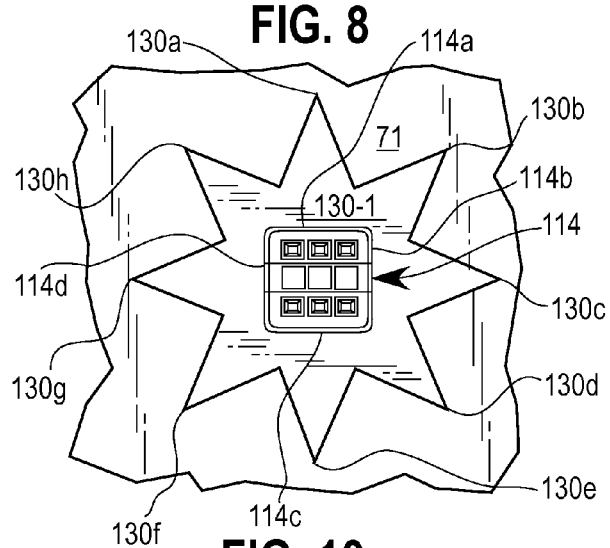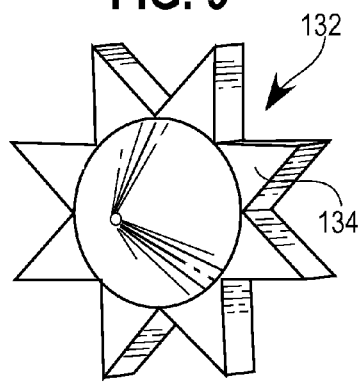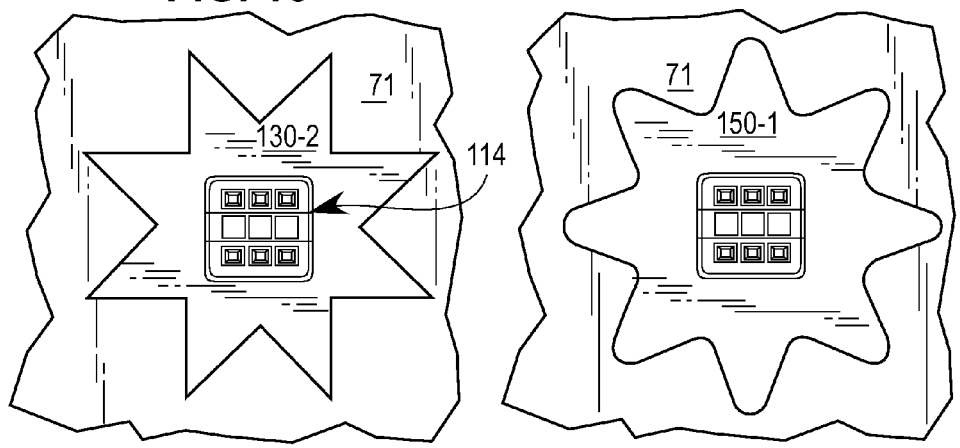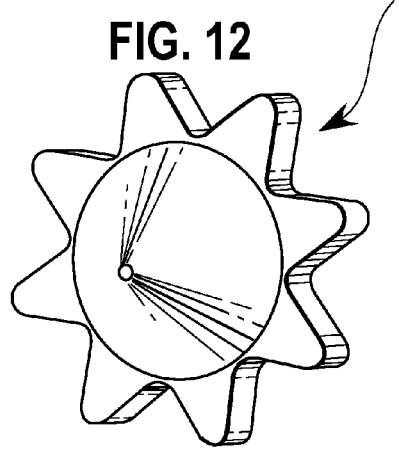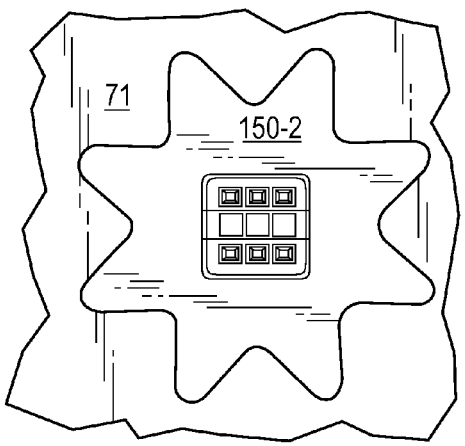

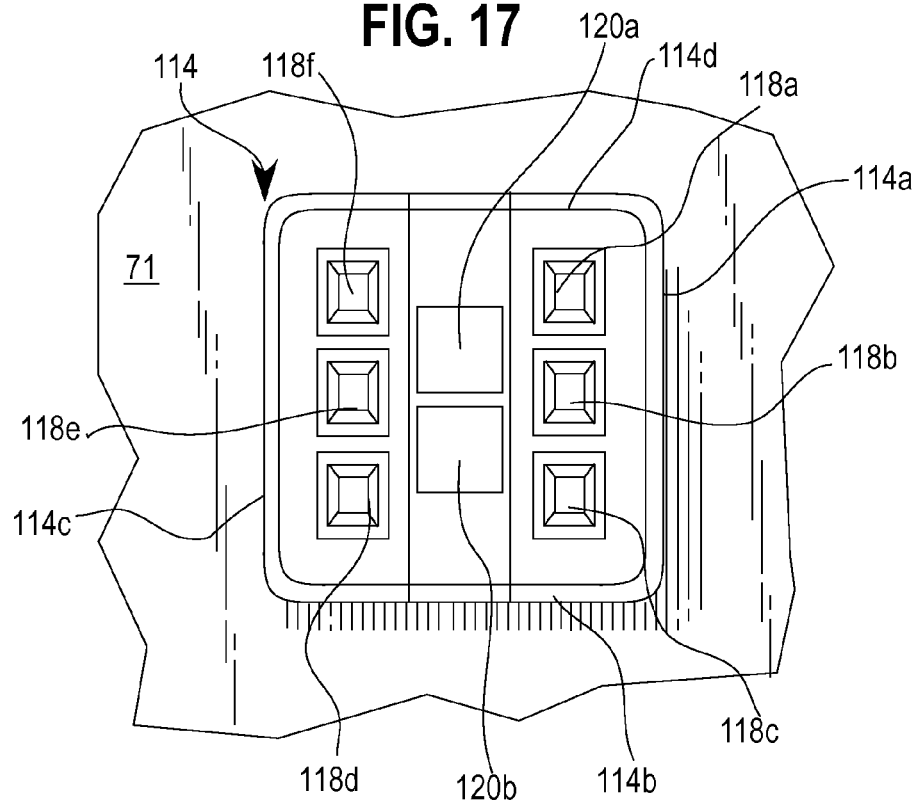
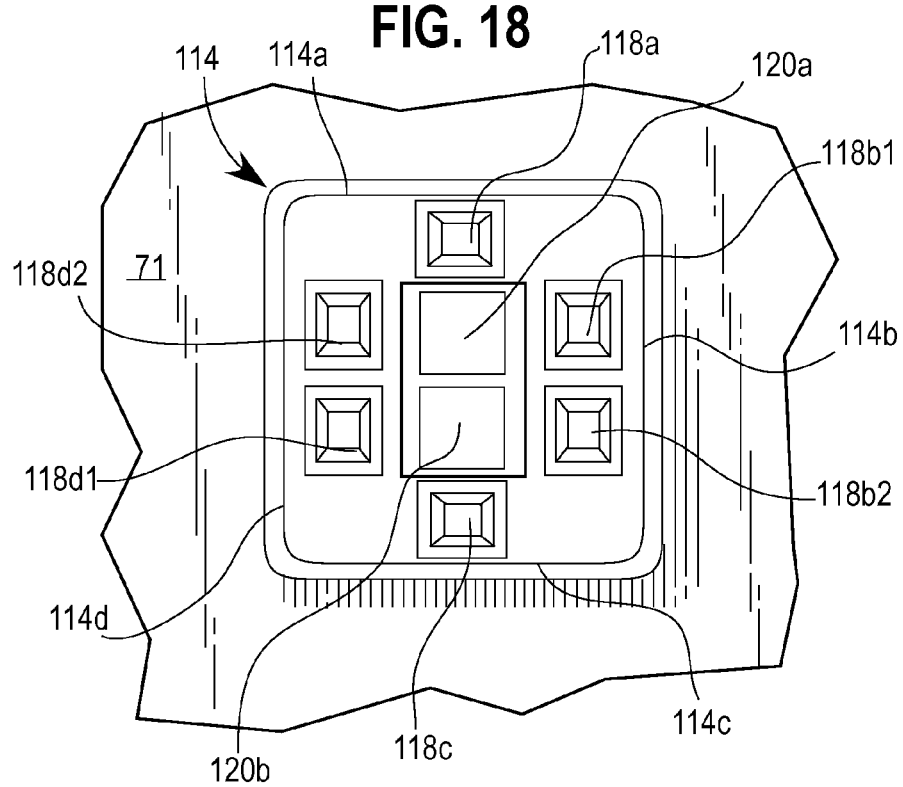

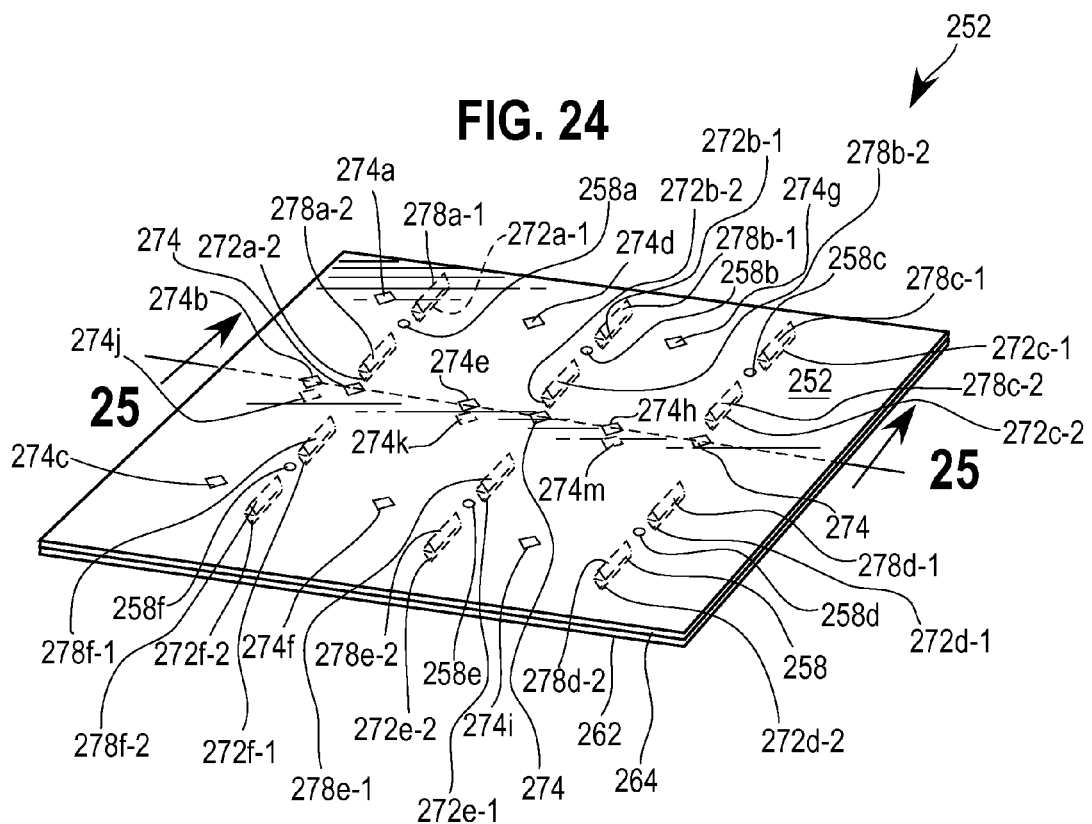

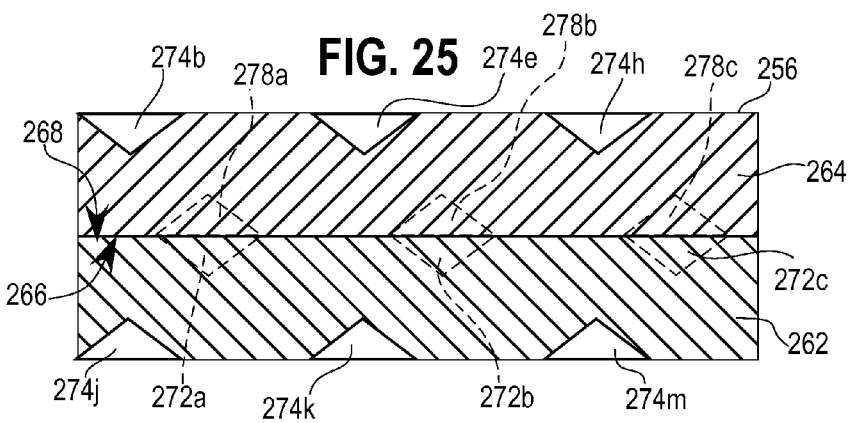
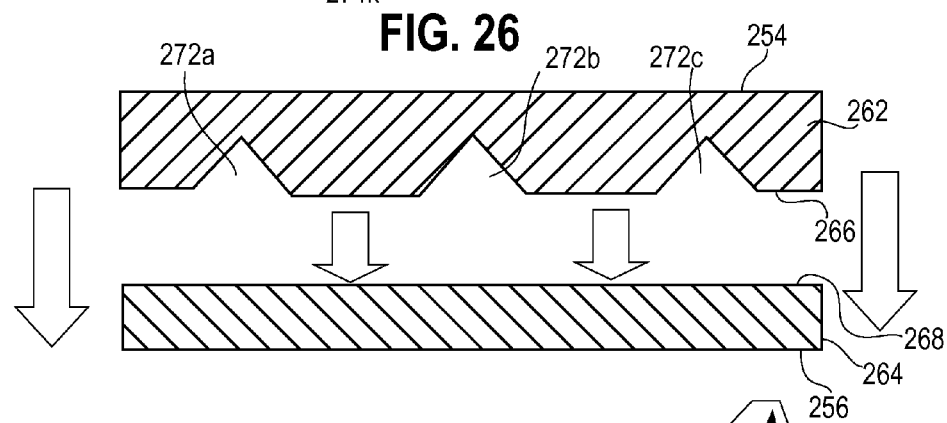
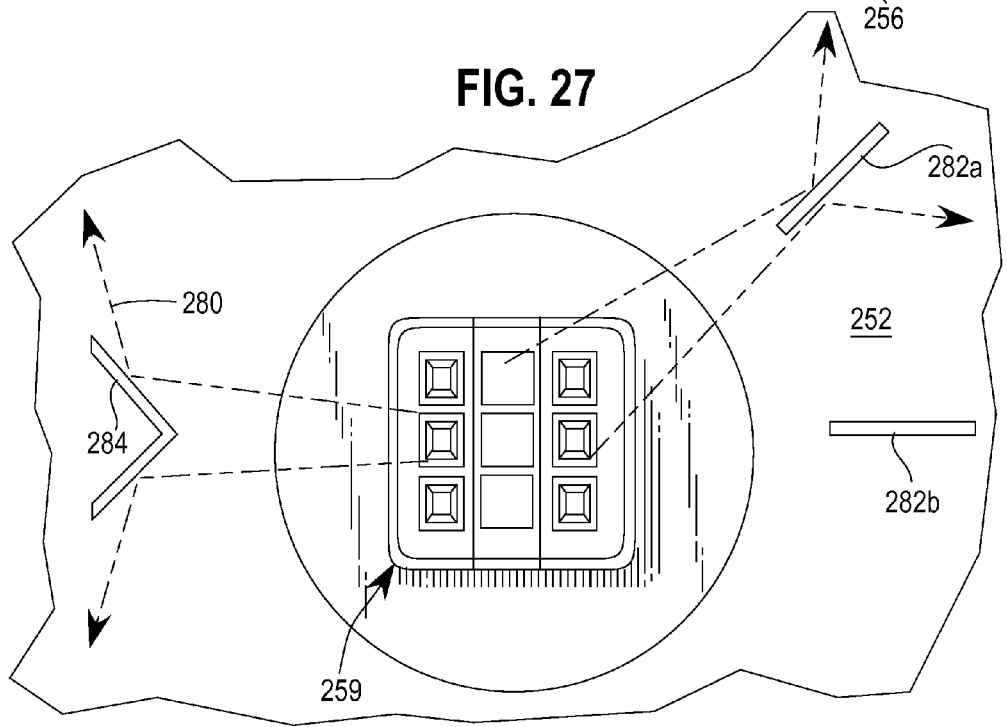

LED PACKAGES AND LUMINAIRES INCORPORATING SAME

CROSS REFERENCE TO RELATED APPLICATIONS

The present application claims the benefit of U.S. Provisional Patent Application Ser. No. 61/758,660, filed Jan. 30, 2013, entitled "Optical Waveguide" and further claims the benefit of U.S. Provisional Patent Application Ser. No. 61/922,017, filed Dec. 30, 2013, entitled "Optical Waveguide Bodies and Luminaires Utilizing Same". The present application further comprises a continuation-in-part of U.S. patent application Ser. No. 13/842,521, filed Mar. 15, 2013, entitled "Optical Waveguides", and further comprises a continuation-in-part of U.S. patent application Ser. No. 13/839,949, filed Mar. 15, 2013, entitled "Optical Waveguide and Lamp Including Same", and further comprises a continuation-in-part of U.S. patent application Ser. No. 13/841,074, filed Mar. 15, 2013, entitled "Optical Waveguide Body", and further comprises a continuation-in-part of U.S. patent application Ser. No. 13/840,563, filed Mar. 15, 2013, entitled "Optical Waveguide and Luminaire Incorporating Same", and further comprises a continuation-in-part of U.S. patent application Ser. No. 13/938,877, filed Jul. 10, 2013, entitled "Optical Waveguide and Luminaire Incorporating Same", and further comprises a continuation-in-part of U.S. patent application Ser. No. 14/101,086, filed Dec. 9, 2013, entitled "Optical Waveguides and Luminaires Incorporating Same", and further comprises a continuation-in-part of U.S. patent application Ser. No. 14/101,132, filed Dec. 9, 2013, "Waveguide Bodies Including Redirection Features and Methods of Producing Same", and further comprises a continuation-in-part of U.S. patent application Ser. No. 14/101,147, filed Dec. 9, 2013, entitled "Luminaires Using Waveguide Bodies and Optical Elements", and further comprises a continuation-in-part of U.S. patent application Ser. No. 14/101,099, filed Dec. 9, 2013, entitled "Optical Waveguide Assembly and Light Engine Including Same", and further comprises a continuation-in-part of U.S. patent application Ser. No. 14/101,129, filed Dec. 9, 2013, entitled "Simplified Low Profile Module With Light Guide For Pendant, Surface Mount, Wall Mount and Stand Alone Luminaires", and further comprises a continuation-in-part of U.S. patent application Ser. No. 14/101,051, filed Dec. 9, 2013, entitled "Optical Waveguide and Lamp Including Same", all owned by the assignee of the present application, and the disclosures of which are incorporated by reference herein.

REFERENCE REGARDING FEDERALLY SPONSORED RESEARCH OR DEVELOPMENT

Not applicable

SEQUENTIAL LISTING

Not applicable

FIELD OF THE INVENTION

The present inventive subject matter relates to optical waveguides lighting devices, and more particularly to optical waveguides LED packages for general lighting.

BACKGROUND OF THE INVENTION

An optical waveguide mixes and directs light emitted by one or more light sources, such as one or more light emitting diodes (LEDs). A typical optical waveguide includes three main components: one or more coupling elements, one or more distribution elements, and one or more extraction elements. The coupling component(s) direct light into the distribution element(s), and condition the light to interact with the subsequent components. The one or more distribution elements control how light flows through the waveguide and is dependent on the waveguide geometry and material. The extraction element(s) determine how light is removed by controlling where and in what direction the light exits the waveguide.

When designing a coupling optic, the primary considerations are: maximizing the efficiency of light transfer from the source into the waveguide; controlling the location of light injected into the waveguide; and controlling the angular distribution of the light in the coupling optic. One way of controlling the spatial and angular spread of injected light is by fitting each source with a dedicated lens. These lenses can be disposed with an air gap between the lens and the coupling optic, or may be manufactured from the same piece of material that defines the waveguide's distribution element(s). Discrete coupling optics allow numerous advantages such as higher efficiency coupling, controlled overlap of light flux from the sources, and angular control of how the injected light interacts with the remaining elements of the waveguide. Discrete coupling optics use refraction, total internal reflection, and surface or volume scattering to control the distribution of light injected into the waveguide.

After light has been coupled into the waveguide, it must be guided and conditioned to the locations of extraction. The simplest example is a fiber-optic cable, which is designed to transport light from one end of the cable to another with minimal loss in between. To achieve this, fiber optic cables are only gradually curved and sharp bends in the waveguide are avoided. In accordance with well-known principles of total internal reflectance light traveling through a waveguide is reflected back into the waveguide from an outer surface thereof, provided that the incident light does not exceed a critical angle with respect to the surface.

In order for an extraction element to remove light from the waveguide, the light must first contact the feature comprising the element. By appropriately shaping the waveguide surfaces, one can control the flow of light across the extraction feature(s). Specifically, selecting the spacing, shape, and other characteristic(s) of the extraction features affects the appearance of the waveguide, its resulting distribution, and efficiency.

Hulse U.S. Pat. No. 5,812,714 discloses a waveguide bend element configured to change a direction of travel of light from a first direction to a second direction. The waveguide bend element includes a collector element that collects light emitted from a light source and directs the light into an input face of the waveguide bend element. Light entering the bend element is reflected internally along an outer surface and exits the element at an output face. The outer surface comprises beveled angular surfaces or a curved surface oriented such that most of the light entering the bend element is internally reflected until the light reaches the output face.

Parker et al. U.S. Pat. No. 5,613,751 discloses a light emitting panel assembly that comprises a transparent light emitting panel having a light input surface, a light transition area, and one or more light sources. Light sources are preferably embedded or bonded in the light transition area to eliminate any air gaps, thus reducing light loss and maximizing the emitted light. The light transition area may include reflective and/or refractive surfaces around and behind each light source to reflect and/or refract and focus the light more efficiently through the light transition area into the light input surface of the light emitting panel. A pattern of light extracting deformities, or any change in the shape or geometry of the panel surface, and/or coating that causes a portion of the light to be emitted, may be provided on one or both sides of the panel members. A variable pattern of deformities may break up the light rays such that the internal angle of reflection of a portion of the light rays will be great enough to cause the light rays either to be emitted out of the panel or reflected back through the panel and emitted out of the other side.

Shipman, U.S. Pat. No. 3,532,871 discloses a combination running light reflector having two light sources, each of which, when illuminated, develops light that is directed onto a polished surface of a projection. The light is reflected onto a cone-shaped reflector. The light is transversely reflected into a main body and impinges on prisms that direct the light out of the main body.

Simon U.S. Pat. No. 5,897,201 discloses various embodiments of architectural lighting that is distributed from contained radially collimated light. A quasi-point source develops light that is collimated in a radially outward direction and exit means of distribution optics direct the collimated light out of the optics.

Kelly et al. U.S. Pat. No. 8,430,548 discloses light fixtures that use a variety of light sources, such as an incandescent bulb, a fluorescent tube and multiple LEDs. A volumetric diffuser controls the spatial luminance uniformity and angular spread of light from the light fixture. The volumetric diffuser includes one or more regions of volumetric light scattering particles. The volumetric diffuser may be used in conjunction with a waveguide to extract light.

Dau et al U.S. Pat. No. 8,506,112 discloses illumination devices having multiple light emitting elements, such as LEDs disposed in a row. A collimating optical element receives light developed by the LEDs and a light guide directs the collimated light from the optical element to an optical extractor, which extracts the light.

A.L.P. Lighting Components, Inc. of Niles, Ill., manufactures a waveguide having a wedge shape with a thick end, a narrow end, and two main faces therebetween. Pyramid-shaped extraction features are formed on both main faces. The wedge waveguide is used as an exit sign such that the thick end of the sign is positioned adjacent a ceiling and the narrow end extends downwardly. Light enters the waveguide at the thick end and is directed down and away from the waveguide by the pyramid-shaped extraction features.

Low-profile LED-based luminaires have recently been developed (e.g., General Electric's ET series panel troffers) that utilize a string of LED elements directed into the edge of a waveguiding element (an "edge-lit" approach). However, such luminaires typically suffer from low efficiency due to losses inherent in coupling light emitted from a predominantly Lambertian emitting source such as a LED element into the narrow edge of a waveguide plane.

SUMMARY OF THE INVENTION

According to one aspect, an LED package comprises a plurality of LEDs and a primary optic disposed adjacent the LEDs. The primary optic includes protrusions for mixing light developed by the plurality of LEDs.

According to yet another aspect, an LED package comprises a plurality of multicolor LEDs and a primary optic disposed adjacent the LEDs. The primary optic includes at least one feature that mixes light developed by the plurality of multicolor LEDs wherein the at least one feature has at least one of a positive inflection and a negative inflection.

According to a still further aspect, a luminaire comprises waveguide body including a coupling cavity and a plug member having a first portion disposed in the coupling cavity. The plug member has an outer surface substantially conforming to the coupling cavity and a second portion extending from the first portion into the coupling cavity and further has a reflective surface adapted to direct light in the coupling cavity into the waveguide body. The waveguide body further has a plurality of extraction features. LED elements disposed in the coupling cavity include at least one LED of a first spectral emission characteristic and at least one LED of a second different spectral emission characteristic. A primary lens is disposed adjacent the LED elements having at least one feature that mixes light produced thereby.

Other aspects and advantages of the present invention will become apparent upon consideration of the following detailed description and the attached drawings wherein like numerals designate like structures throughout the specification.

BRIEF DESCRIPTION OF THE DRAWINGS

FIG. 1 is an isometric view of a first embodiment of a luminaire incorporating one or more waveguides;

FIG. 1A is an isometric view of a second embodiment of a luminaire incorporating one or more waveguides;

FIG. 4 is an enlarged, isometric view of the plug member of FIG. 1;

FIG. 5 is an elevational view of the LED element used in the luminaire of FIG. 1;

FIG. 6 is an elevational view of the LED element disposed in a first alternative coupling cavity that may be incorporated in the luminaire of FIG. 1;

FIG. 7 is an enlarged, isometric view of a first alternative plug member that may be used in the coupling cavity of FIG. 6;

FIG. 8 is an elevational view of the LED element disposed in a second alternative coupling cavity that may be incorporated in the luminaire of FIG. 1;

FIG. 9 is an enlarged, isometric view of a second alternative plug member that may be used in the coupling cavity of FIG. 8;

FIG. 10 is an elevational view of the LED element disposed in a third alternative coupling cavity that may be incorporated in the luminaire of FIG. 1;

FIG. 11 is an elevational view of the LED element disposed in a fourth alternative coupling cavity that may be incorporated in the luminaire of FIG. 1;

FIG. 12 is an enlarged, isometric view of a third alternative plug member that may be used in the coupling cavities of FIGS. 11 and 13;

FIG. 13 is an elevational view of the LED element disposed in a fifth alternative coupling cavity that may be incorporated in the luminaire of FIG. 1;

FIGS. 17 and 18 are elevational views of first and second alternative LED elements that may be used in any of the luminaires disclosed herein;

FIG. 24 is an isometric view of a waveguide having first alternative redirection features;

FIG. 25 is a sectional view of the waveguide having first alternative redirection features taken generally along the lines 25-25 of FIG. 24;

FIG. 26 is an elevational view of the waveguide having first alternative redirection features during fabrication;

FIG. 27 is an elevational view of a waveguide having second and third alternative redirection features;

DETAILED DESCRIPTION OF THE PREFERRED EMBODIMENTS

Figure 2:
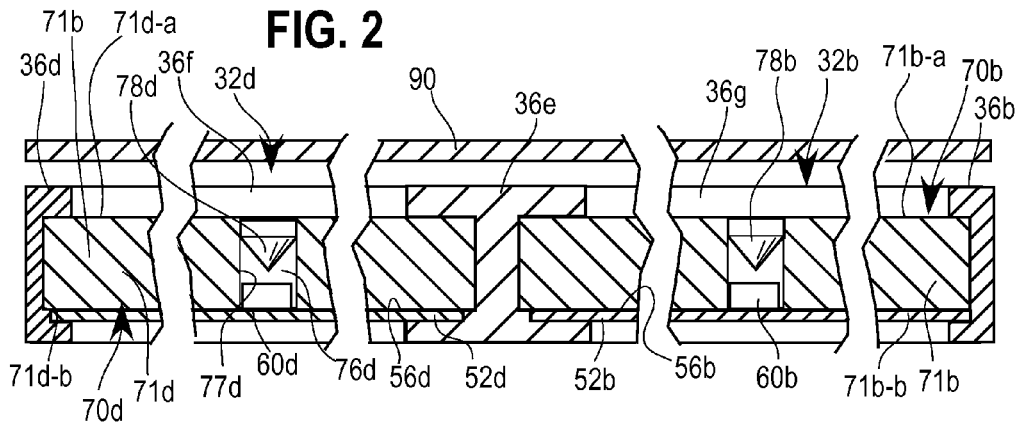
FIG. 2 is a sectional view taken generally along the lines 2-2 of FIG. 1.

Some of the devices described herein utilize a "back-lit" approach in which one or more LED element(s) are located at least partially within one or more coupling cavities each in the form of a hole or depression in a waveguide body. In the embodiment shown in the figures, the coupling cavity extends fully through the waveguide body, although the coupling cavity may extend only partially through the waveguide body. A plug member disposed at least partially in the coupling cavity or formed integrally with the waveguide body to define the coupling cavity diverts light into the waveguide body. Light extraction features may be disposed in or on one or more surfaces of the waveguide body. A diffuser may be disposed adjacent the waveguide body proximate the plug member(s). In such an arrangement, light emitted by the LED element(s) is efficiently coupled into the waveguide body with a minimum number of bounces off of potentially absorbing surfaces, thus yielding high overall system efficiency. This arrangement also offers additional potential benefits in that multiple LED elements may be placed apart at greater distances, thereby reducing the need for costly and bulky heat sinking elements. Further, this approach is scalable in that the distance that light must travel through the waveguide body may be effectively constant as the luminaire size increases.

In the back-lit approach described in the immediately preceding paragraph, it is desirable that the proper amount of light is transmitted through each plug member such that the local region on the diffuser aligned with the plug member shows neither a bright nor a dark spot, nor a spot with a color that differs noticeably from the surrounding regions. Because the volume of the plug member is generally small, it is necessary to provide the plug member with a high degree of opacity, which can be achieved by incorporating highly scattering particles that are typically small in diameter in the material of the plug member. However, small particle diameter typically leads to preferential scattering of short wavelength (blue) light. As a result, the light transmitted through the plug member may have a noticeable yellowish tint, which is typically undesirable.

Further, there exist practical limits on the amount of scattering material that may be incorporated into the plug member. As a result, it may not be possible to achieve sufficient opacity without high absorption using scattering particles that are incorporated into the plug member material. Finally, in regions where the plug member is in contact with the sidewall of the coupling cavity, the index of refraction difference interface at the surface of the cavity may be interrupted, thereby allowing light to transmit from the plug member into the waveguide but not subject to refraction necessary to ensure total TIR within the waveguide.

Still further, a number of LEDs of the same color together comprising an LED element may be disposed in one or more of the coupling cavities. Alternatively, a number of LEDs not all of the same color and together comprising a multi-color LED element may be used in one or more of the coupling cavities of the luminaire in order to achieve a desired lighting effect, such as a particular color temperature. In the former case, a non-uniform intensity of light may be produced. In the latter case, a multi-color LED element may be subject to non-uniform color distribution at high angles, leading to non-uniformity in the color and intensity of output luminance. A non-uniform color distribution also may result from a multi-color LED element having different color LEDs with varying heights. For example, a multi-color LED element may include one or more red LEDs surrounded by a plurality of blue-shifted yellow LEDs. Each red LED has a height that is less than a height of the surrounding blue-shifted yellow LEDs. The light emitted from the red LED, therefore, is obstructed at least in part by the blue-shifted yellow LED, such that the light emanating from the LED element is not uniform. In addition to height differences, differences in the nature of the red and blue-shifted yellow LEDs affect the way the light is emitted from the respective LED.

According to an aspect of the present invention, the coupling cavities may have any of a number of geometries defined by surfaces that promote redirection of the light rays (e.g., through refraction) to better mix the light rays developed by the LEDs. Other design features are disclosed herein according to other aspects that promote light mixing and/or color and/or light intensity uniformity. Thus, for example, some embodiments comprehend the use of a thin reflective layer, such as a metal layer, on a portion of each plug member wherein the layer is of appropriate thickness to allow sufficient light to transmit without substantial shift in color.

Other embodiments relate to the fabrication and surface smoothness of the surface(s) defining the cavity or cavities, change in LED position and/or other modifications to the LED(s) or LED element(s), use of internal TIR features inside the waveguide body, and/or use of one or more masking elements to modify luminance over the surface of the luminaire module.

Specifically, FIGS. 1 and 2 illustrate a low profile luminaire 30 utilizing one or more back-lit waveguide luminaire portions 32a-32d to spread light uniformly. Each waveguide luminaire portion 32a-32d is joined or secured to other portions 32 by any suitable means, such as a frame 34 including outer frame members 36a-36d and inner frame members 36e-36g that are secured to one another in any suitable manner. One or more of the frame members may be coated with a reflective white or specular coating or other material, such as paper or a scattering film, on surfaces thereof that abut the portions 32. Alternatively, the luminaire portions 32 may abut one another directly, or may be separated from one another by an air gap, an optical index matching coupling gel, or the like. In these latter embodiments, the luminaire portions 32 may be secured together by any suitable apparatus that may extend around all of the portions 32 and/or some or all of the individual portions 32. In any event, the luminaire 30 may comprise a troffer sized to fit within a recess in a dropped ceiling, or may have a different size and may be suspended from a ceiling, either alone or in a fixture or other structure. The luminaire 30 is modular in the sense that any number of luminaire portions 32 may be joined to one another and used together. Also, the size of each luminaire portion 32 may be selected so that the luminaire portions may all be of a small size (e.g., about 6 in by 6 in or smaller), a medium size (e.g., about 1 ft by 1 ft), or a large size (e.g., about 2 ft by 2 ft or larger), or may be of different sizes, as desired. For example, as seen in FIG. 1A, an alternative luminaire 30-1 may have one large luminaire portion 32a-1 of a size of about 2 ft by 2 ft, a medium luminaire portion 32b-1 of a size of about 1 ft by 1 ft, and four small luminaire portions 32c-1 through 32c-4 each of a size of about 6 in by 6 in, wherein the luminaire portions 32 are maintained in assembled relation by a frame 34 comprising frame members 36a-1 through 36a-4 and 36b-1 through 36b-5. (The luminaire portion sizes noted above are approximate in the sense that the frame dimensions are not taken into account.) Any other overall luminaire size and/or shape and/or combinations of luminaire portion size(s), number(s), and relative placement are possible.

As seen in FIG. 2, each luminaire portion 32 includes a base element in the form of a substrate 52 having a base surface 56. If desired, the base surface 56 may be covered or coated by a reflective material, which may be a white material or a material that exhibits specular reflective characteristics. A light source 60 that may include one or more light emitting diodes (LEDs) is mounted on the base surface 56. The light source 60 may be one or more white or other color LEDs or may comprise multiple LEDs either mounted separately or together on a single substrate or package including a phosphor-coated LED either alone or in combination with at least one color LED, such as a green LED, a yellow or amber LED, a red LED, etc. In those cases where a soft white illumination is to be produced, the light source 60 typically includes one or more blue shifted yellow LEDs and one or more red LEDs. Different color temperatures and appearances could be produced using other LED combinations, as is known in the art. In one embodiment, the light source comprises any LED, for example, an MT-G LED element incorporating TrueWhite® LED technology or as disclosed in U.S. patent application Ser. No. 13/649,067, filed Oct. 10, 2012, entitled "LED Package with Multiple Element Light Source and Encapsulant Having Planar Surfaces" by Lowes et al., the disclosure of which is hereby incorporated by reference herein, both as developed by Cree, Inc., the assignee of the present application. In any of the embodiments disclosed herein the LED(s) have a particular emission distribution, as necessary or desirable. For example, a side emitting LED disclosed in U.S. Pat. No. 8,541,795, the disclosure of which is incorporated by reference herein, may be utilized inside the waveguide body. More generally, any lambertian, symmetric, wide angle, preferential-sided, or asymmetric beam pattern LED(s) may be used as the light source.

The light source 60 is operated by control circuitry (not shown) in the form of a driver circuit that receives AC or DC power. The control circuitry may be disposed on the substrate 52 or may be located remotely, or a portion of the control circuitry may be disposed on the substrate and the remainder of the control circuitry may be remotely located. In any event, the control circuitry is designed to operate the light source 60 with AC or DC power in a desired fashion to produce light of a desired intensity and appearance. If necessary or desirable, a heat exchanger (not shown) is arranged to dissipate heat and eliminate thermal crosstalk between the LEDs and the control circuitry. Preferably, the light source 60 develops light appropriate for general illumination purposes including light similar or identical to that provided by an incandescent, halogen, or other lamp that may be incorporated in a down light, a light that produces a wall washing effect, a task light, a troffer, or the like.

A waveguide 70 has a main body of material 71 (FIG. 2), which, in the illustrated embodiment, has a width and length substantially greater than an overall thickness d thereof and, in the illustrated embodiment, is substantially or completely rectangular or any other shape in a dimension transverse to the width and thickness (FIG. 1). Preferably, the thickness d may be at least about 500 microns, and more preferably is between about 500 microns and about 10 mm, and is most preferably between about 3 mm and about 5 mm. The waveguide body 71 may be made of any suitable optical grade material including one or more of acrylic, air, molded silicone, polycarbonate, glass, and/or cyclic olefin copolymers, and combinations thereof, particularly (although not necessarily) in a layered arrangement to achieve a desired effect and/or appearance.

In the illustrated embodiment, the waveguide body 71 has a constant thickness over the width and length thereof, although the body 71 may be tapered linearly or otherwise over the length and/or width such that the waveguide body 71 is thinner at one or more edges than at a central portion thereof. The waveguide body 71 further includes a first or outer side or surface 71a, a second opposite inner side or surface 71b, and an interior coupling cavity 76. The interior coupling cavity 76 is defined by a surface 77 that, in the illustrated embodiment, extends partially or fully through the waveguide 70 from the first side toward the second side. Also in some of the illustrated embodiments, the surface 77 defining the cavity 76 is preferably (although not necessarily) normal to the first and second sides 71a, 71b of the waveguide 70 and the cavity 76 is preferably, although not necessarily, centrally located with an outer surface of the main body of material 71. In some or all of the embodiments disclosed herein, the surface 77 (and, optionally, the surfaces defining alternate cavities described herein) is preferably polished and optically smooth. Also preferably, the light source 60 extends into the cavity 76 from the first side thereof. Still further in the illustrated embodiment, a light diverter of any suitable shape and design, such as a conical plug member 78, extends into the cavity 76 from the second side thereof. Referring to FIGS. 2-4, in a first embodiment, the surface 77 is circular cylindrical in shape and the conical plug member 78 includes a first portion 80 that conforms at least substantially, if not completely, to the surface 77 (i.e., the first portion 80 is also circular cylindrical in shape) and the first portion 80 is secured by any suitable means, such as, an interference or press fit or an adhesive, to the surface 77 such that a second or conical portion 82 of the plug member 78 extends into the cavity 76. Preferably, although not necessarily, the conformance of the outer surface of the first portion 80 to the surface 77 is such that no substantial gaps exist between the two surfaces where the surfaces are coextensive. Still further, if desired, the conical plug member 78 may be integral with the waveguide body 71 rather than being separate therefrom. Further, the light source 60 may be integral with or encased within the waveguide body 71, if desired. In the illustrated embodiment, the first portion 80 preferably has a diameter of at least 500 um, and more preferably between about 1 mm and about 20 mm, and most preferably about 3 mm. Further in the illustrated embodiment, the first portion 80 has a height normal to the diameter of at least about 100 um, and more preferably between about 500 um and about 5 mm, and most preferably about 1 mm. Still further in the illustrated embodiment, the second portion 82 forms an angle relative to the portion 80 of at least about 0 degrees, and more preferably between about 15 degrees and about 60 degrees, and most preferably about 20 degrees. The plug member 78 may be made of white polycarbonate or any other suitable transparent or translucent material, such as acrylic, molded silicone, polytetrafluoroethylene (PTFE), Deirin® acetyl resin, or any other suitable material. The material of the plug member 78 may be the same as or different than the material of the waveguide body 71.

Figure 3A:
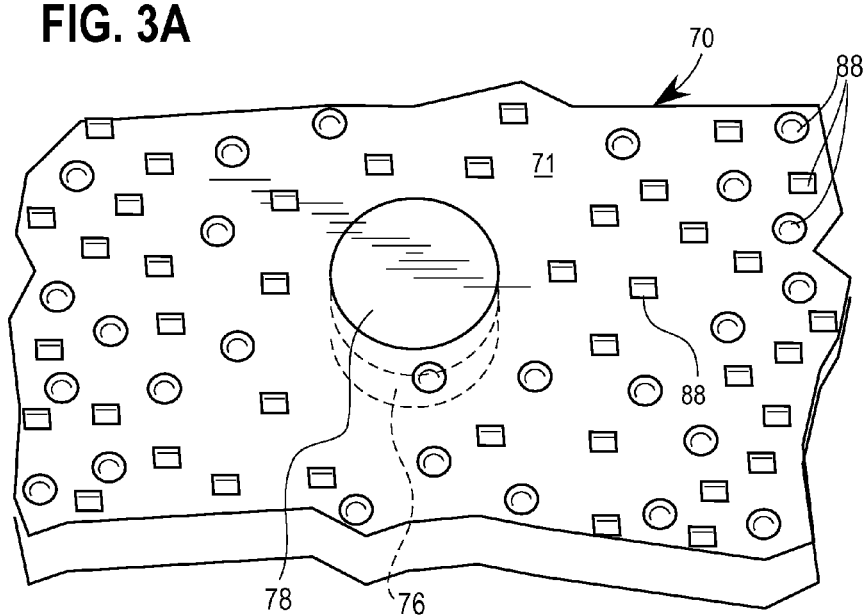
FIGS. 3A, 3B, and 3C are fragmentary, enlarged, isometric views of the first embodiment of FIG. 1 illustrating various extraction features.
Figure 3B:
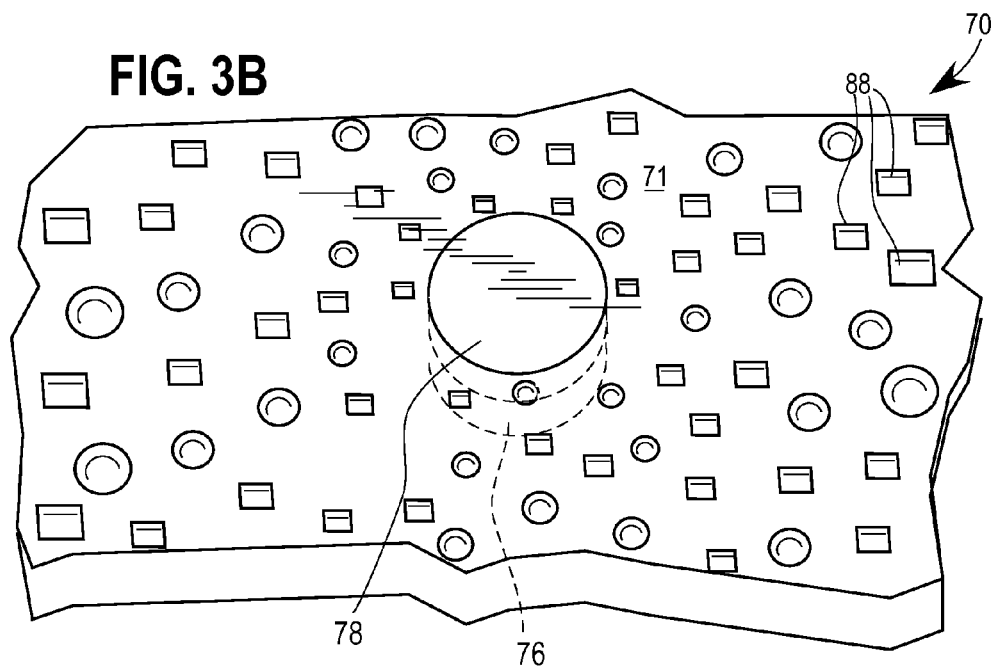

In all of the embodiments disclosed herein, one or more pluralities of light extraction features or elements 88 may be associated with the waveguide body 71. For example one or more light extraction features 88 may be disposed in one or both sides or faces 71a, 71b of the waveguide body 71. Each light extraction feature 88 comprises a wedge-shaped facet or other planar or non-planar feature (e.g., a curved surface such as a hemisphere) that is formed by any suitable process, such as embossing, cold rolling, or the like, as disclosed in U.S. patent application Ser. No. 13/842,521. Preferably, in all of the embodiments disclosed herein the extraction features are disposed in an array such that the extraction features 88 are disposed at a first density proximate the cavity and gradually increase in density or size with distance from the light source 60, as seen in U.S. patent application Ser. No. 13/842,521. In any of the embodiments disclosed herein, as seen in FIGS. 3A and 3B, the extraction features may be similar or identical to one another in shape, size, and/or pitch (i.e., the spacing may be regular or irregular), or may be different from one another in any one or more of these parameters, as desired. The features may comprise indents, depressions, or holes extending into the waveguide, or bumps or facets or steps that rise above the surface of the waveguide, or a combination of both bumps and depressions. Features of the same size may be used, with the density of features increasing with distance from the source, or the density of features may be constant, with the size of the feature increasing with distance from the source and coupling cavity. For example, where the density of the extraction features is constant with the spacing between features of about 500 microns, and each extraction feature comprises a hemisphere, the diameter of the hemisphere may be no greater than about 1 mm, more preferably no greater than about 750 microns, and most preferably no greater than about 100 microns. Where each extraction feature comprises a shape other than a hemisphere, preferably the greatest dimension (i.e., the overall dimension) of each feature does not exceed about 1 mm, and more preferably does not exceed about 750 microns, and most preferably does not exceed about 100 microns. Also, the waveguide body 71 may have a uniform or non-uniform thickness. Irrespective of whether the thickness of the waveguide body 71 is uniform or non-uniform, a ratio of extraction feature depth to waveguide body thickness is preferably between about 1:10,000 and about 1:2, with ratios between about 1:10,000 and about 1:10 being more preferred, and ratios between about 1:1000 and about 1:5 being most preferred.

Figure 3C:
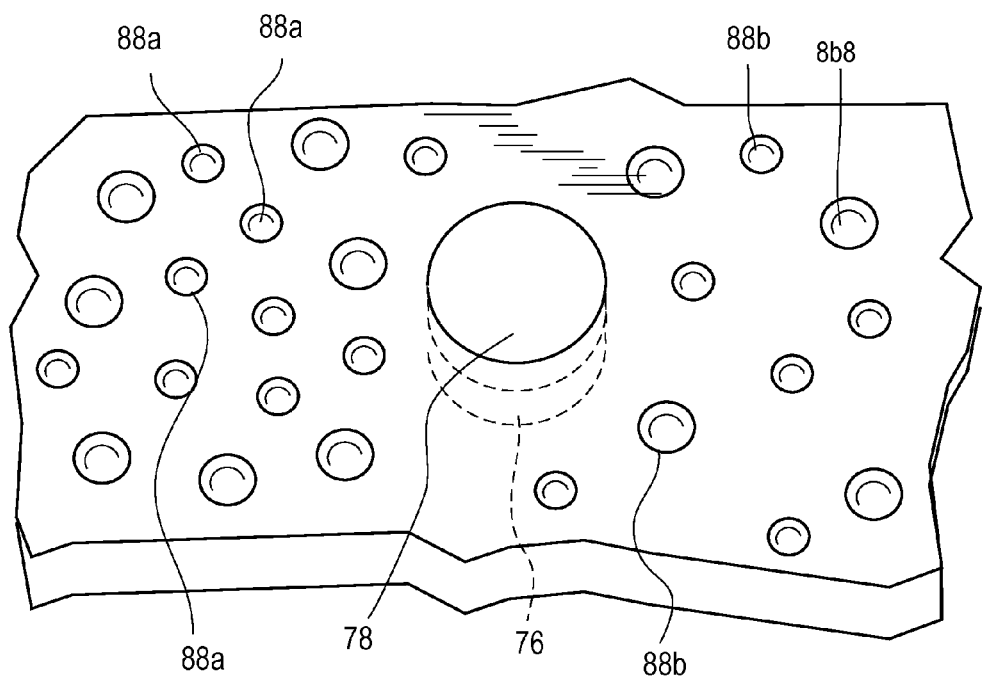

It should also be noted that the extraction features may be of differing size, shape, and/or spacing over the surface(s) of the waveguide body so that an asymmetric emitted light distribution is obtained. For example, FIG. 3C illustrates an arrangement wherein a relatively large number of extraction features 88a are disposed to the left of the coupling cavity 76 and a relatively small number of extraction features 88b are disposed to the right of the coupling cavity 76. As should be evident, more light is extracted from the left side of the waveguide body 71 and relatively less light is extracted from the right side of the waveguide body 71.

In all of the embodiments disclosed herein, the waveguide body may be curved, thereby obviating the need for some or all of the extraction features. Further, a diffuser 90 (FIG. 2) is preferably (although not necessarily) disposed adjacent the side 71a of the waveguide body 71 and is retained in position by any suitable means (not shown).

In the first embodiment, and, optionally, in other embodiments disclosed herein, the second portion 82 of the plug member 78 is coated with a reflecting material using any suitable application methodology, such as a vapor deposition process. Preferably, a thin reflective layer, such as a metal layer of particles, of appropriate layer thickness is uniformly disposed on the conical portion 82 to allow sufficient light to transmit through the plug member 78 so that development of a visually observable spot (either too bright or too dark or color shifted with respect to surrounding regions) is minimized at an outer surface of the diffuser 90 adjacent the plug member 78. In the preferred embodiment the metal layer comprises aluminum or silver. In the case of silver, the reflective layer preferably has a thickness of no greater than about 100 nm, and more preferably has a thickness between about 10 nm and about 70 nm, and most preferably has a thickness of about 50 nm. In the case of aluminum, the reflective layer preferably has a thickness of no greater than about 100 nm, and more preferably has a thickness between about 10 nm and about 50 nm, and most preferably has a thickness of about 30 nm.

In any of the embodiments disclosed herein the second portion 82 of the plug member 78 may be non-conical and may have a substantially flat shape, a segmented shape, a tapered shape, an inclined shape to direct light out a particular side of the waveguide body 71, etc.

In alternate embodiments, as seen in FIGS. 6-16, the plug member 78 has a first portion of any other suitable noncircular shape, including a symmetric or asymmetric shape, as desired, and a second portion preferably (although not necessarily) of conical shape as noted above. The coupling cavity may also (although it need not) have a noncircular shape or the shape may be circular where the first portion 80 is disposed and secured (in which case the first portion 80 is circular cylindrical) and the shape of the coupling cavity may be noncircular in other portions (i.e., at locations remote from the first portion 80).

Specifically referring to FIGS. 6 and 7, a first alternative cavity 100 is illustrated in a waveguide body 71 wherein the cavity 100 is defined by four surfaces 102a-102d. Preferably, the four surfaces 102 are normal to the upper and lower sides 71a, 71b and together define a quadrilateral shape, most preferably, a square shape in elevation as seen in FIG. 6. Each of the surfaces 102 preferably has a side-to-side extent (as seen in FIG. 6) of no less than about 500 um, and more preferably between about 1 mm and 20 mm, depending upon the size of the LED element. The LED light source 60 is disposed in the cavity 100, similar or identical to the embodiment of FIG. 3. A plug member 104 includes a first portion 106 that conforms at least substantially, if not fully, as described in connection with the embodiment of FIG. 3, to the preferably square shape defined by the surfaces 102. Each of the surfaces defining the first portion 106 has a height of no less than about 100 um, and more preferably between about 500 um and 5 mm, and most preferably about 1 mm. The plug member 104 further includes a conical second portion 108 similar or identical to the portion 82 of FIG. 3 both in shape and dimensions. The plug member 104 is otherwise identical to the plug member 78 and, in all of the embodiments disclosed in FIGS. 6-18, the second portion 108 may be coated with the metal layer as described in connection with the plug member 78. The first portion 106 is disposed and retained within the cavity 100 in any suitable manner or may be integral therewith such that the second portion 108 is disposed in the cavity 100 facing the light source 60, as in the embodiment of FIG. 3. Preferably, the surfaces 102 are disposed at 45 degree angles with respect to edges or sides 114a, 114b, 114c, and 114d, respectively, of an LED element 114 comprising the light source 60.

Referring to FIG. 5, the illustrated LED element 114 comprises six blue-shifted yellow LEDs 118a-118f disposed in two rows of three LEDs located adjacent the edges or sides 114a, 114c. Three red LEDs 120a-120c are disposed in a single row between the two rows of blue-shifted LEDs 118. (The embodiments of FIGS. 6-18 are illustrated with the LED 114 element disposed in the same orientation as that illustrated in FIG. 6). The light from the LEDs 118 and 120 is mixed by the interaction of the light rays with the index of refraction interface at the surfaces 102 so that the ability to discern separate light sources is minimized.

FIGS. 8-10 illustrate embodiments wherein a star-shaped cavity 130 is formed in the waveguide body 71 and a star shaped plug member 132 is retained within the star shaped cavity. Thus, for example, FIG. 8 a star-shaped cavity 130-1 having eight equally spaced points 130a-130h is formed in the waveguide body 71 such that points 130a, 130c, 130e, and 130g are aligned with the sides 114a, 114b, 114c, and 114d, respectively, of the LED element 114. FIG. 10 illustrates a cavity 130-2 identical to the cavity 130-1 of FIG. 8 except that the cavity 130-2 is rotated 22.5 degrees counterclockwise relative to the cavity 130-1. In both of the embodiments of FIGS. 8-10 the plug member 132 includes a first portion 134 that substantially or completely conforms to the walls defining the cavity 130. In this embodiment, the cavity 130 and plug member 132 have sharp points.

FIGS. 11-13 illustrate embodiments identical to FIGS. 8-10 with the exception that eight-pointed cavities 150-1 and 150-2 and plug member 152 have rounded or filleted points. Preferably, each fillet has a radius of curvature between about 0.1 mm and about 0.4 mm, and more preferably has a radius of curvature between about 0.2 mm and 0.3 mm, and most preferably has a radius of curvature of about 0.25 mm.

Figure 14:
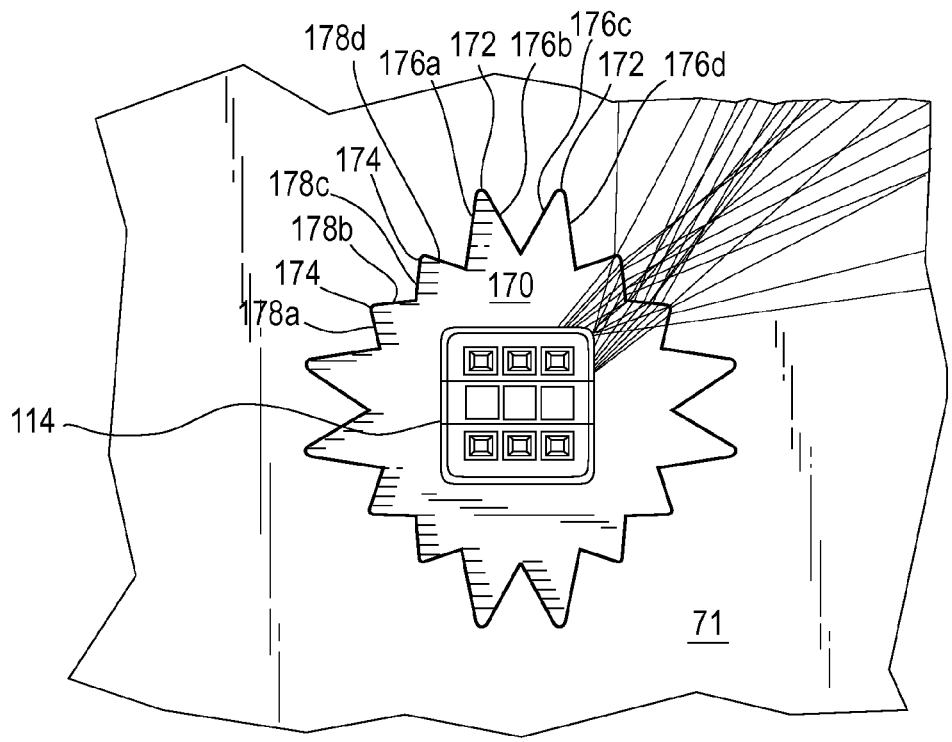
FIG. 14 is an elevational view of the LED element disposed in a sixth alternative coupling cavity that may be incorporated in the luminaire of FIG. 1.
Figure 15:
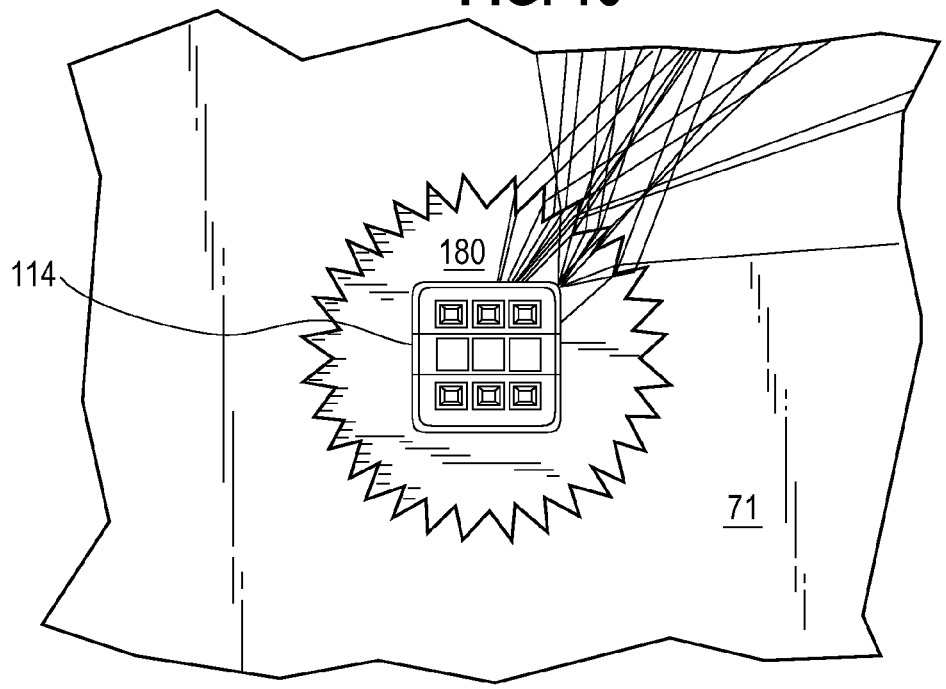
FIG. 15 is an elevational view of the LED element disposed in a seventh alternative coupling cavity that may be incorporated in the luminaire of FIG. 1.
Figure 16:
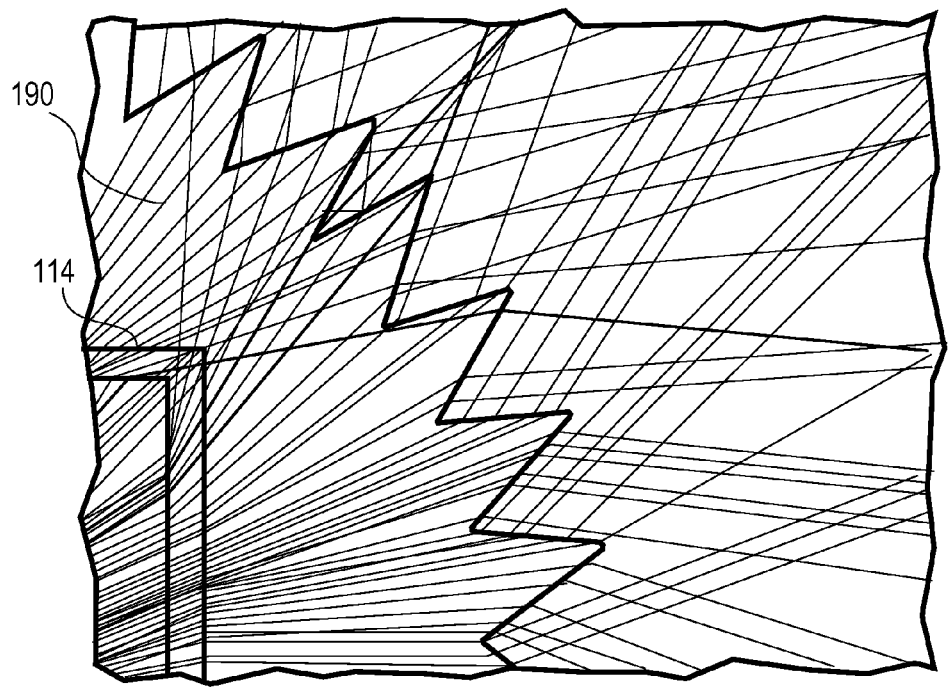
FIG. 16 is a fragmentary, enlarged, elevational view of a portion of the LED element disposed in the seventh alternative coupling cavity of FIG. 15.

Of course, any of the embodiments disclosed herein may have a different number of points, whether sharp pointed or rounded, or a combination of the two. FIGS. 14-16 illustrate embodiments of cavities 170, 190 (and corresponding first portions of associated plug members) having relatively large numbers of points (16 points in FIG. 14, 32 points in FIGS. 15 and 16) of different shapes and sizes. In these alternative embodiments, the star shaped coupling cavity includes a first plurality of points 172 (FIG. 14) and a second plurality of points 174, and the first plurality of points 172 have a different shape than the second plurality of points 174. Thus, the coupling cavity is defined by a first set of surfaces 176a-176d (defining the first plurality of points 172) that direct a first distribution of light into the waveguide body and a second set of surfaces 178a-178d (defining the second plurality of points 174) that direct a second distribution of light different than the first distribution of light into the waveguide body. In these embodiments, the angles of the surfaces with respect to the central axis impact the luminance uniformity and color mixing of the light emitted from the light source. In particular, light uniformity and color mixing improve as the angled surface(s) of the coupling cavity become increasingly parallel with light rays (within Fresnel scattering angular limits, as should be evident to one of ordinary skill in the art), thus maximizing the angle of refraction, and hence light redirection, as the rays traverse the interface between the low index of refraction medium (air) and the higher index of refraction medium (the waveguide). While light uniformity and color mixing may be enhanced using complex shapes, such benefit must be weighed against the difficulty of producing such shapes.

In each of the embodiments of FIGS. 8, 10, 11 and 13-16, each cavity may have radially maximum size (i.e., the distance between a center or centroid (in the case of noncircular coupling cavity shapes) of the cavity and an outermost portion of the surface(s) defining the cavity) of at least about 100 um, and more preferably between about 1 mm and no more than about 50 mm, and most preferably between about 3 mm and about 20 mm. Further, each cavity may have radially minimum size (i.e., the distance between a center or centroid of the cavity and an innermost portion of the surface(s) defining the cavity) of at least about 100 um, and more preferably between about 1 mm and about 50 mm, and most preferably between about 3 mm and about 20 mm. (The term "centroid" as used herein is defined as the center of gravity of an imaginary mass of constant thickness and uniform density fully occupying the coupling cavity.)

The first and second portions of the plug members of FIGS. 9 and 12 (and plug members that may be used with FIGS. 14 and 15) may be identical to the plug members described previously, with the exception of the outside shape of the first portion, as should be evident.

Ray fan and full simulation analyses of the embodiments shown in FIGS. 6-16 were performed to compare color mixing, luminance, and efficiency of waveguides having various shapes of coupling cavities with the design shown in FIGS. 2-4. Ray fan simulations of LED elements within various-shaped coupling cavities demonstrated the color mixing of light rays emitted horizontally from the LED into the waveguide. Full simulations of LED elements within various shaped coupling cavities demonstrated the color mixing, luminance, and efficiency of light rays emitted from the LED into the waveguide having extraction features. LightTools 8.0 by Synopsys was utilized to perform the simulations, although other software known in the art, such as Optis by Optis or Radiant Zemax by Zemax, may be used.

Figure 16A:
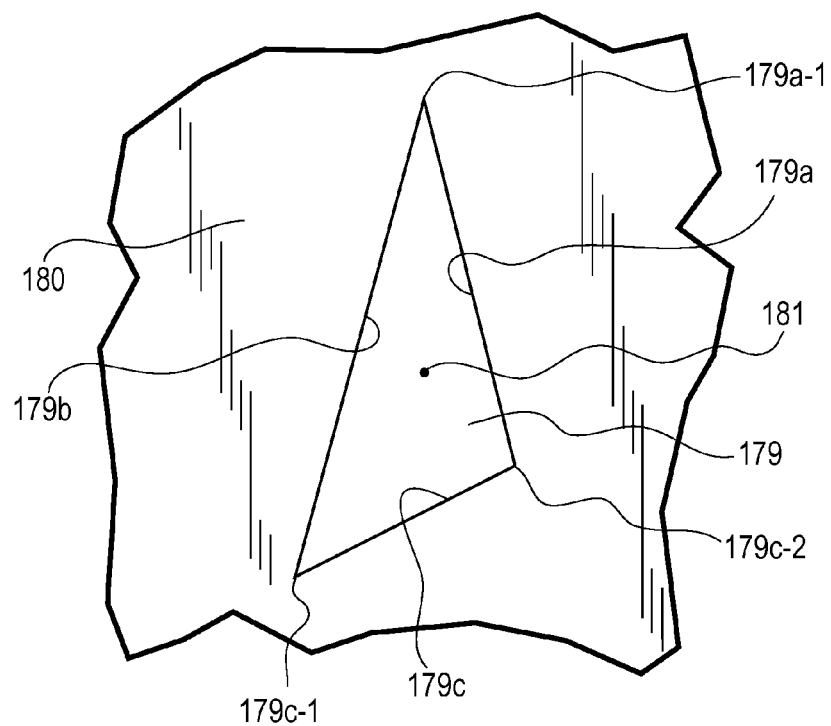
FIG. 16A is an elevational view of an eighth alternative coupling cavity that may be incorporated in the luminaire of FIG. 1.

It should be noted that the coupling cavity may have an asymmetric shape, if desired. FIG. 16A illustrates a triangular coupling cavity 179 defined by three coupling features 179a-179c that extend at least partially between upper and lower surfaces of a waveguide body 180. The cavity 179 has an asymmetric triangular shape with respect to a centroid 181. Although not shown, one or more LEDs and a light diverter extend into the coupling cavity 179 as in the other embodiments disclosed herein.

In embodiments disclosed herein, a coupling cavity is defined by one or more coupling features that extend between the first and second faces wherein at least one of the coupling features extends into the waveguide body to a lateral extent transverse to a depth dimension greater than a lateral extent to which another of the waveguide features extends into the waveguide body. Thus, for example, as seen in FIG. 16A, the coupling feature 179a includes at least one portion 179a-1 that is disposed to a greater extent farther into the waveguide body 180 than portions 179c-1 and 179c-2 of the feature 179c. The same is true of other embodiments. Further, where the coupling surfaces do not extend fully through the waveguide body, the resulting blind cavity may have one or more shaped cavity base surface(s) or a planar cavity base surface and the cavity base surface(s) may (but need not) be coated with a reflective and/or partially light transmissive material, if desired.

Figure 18A:
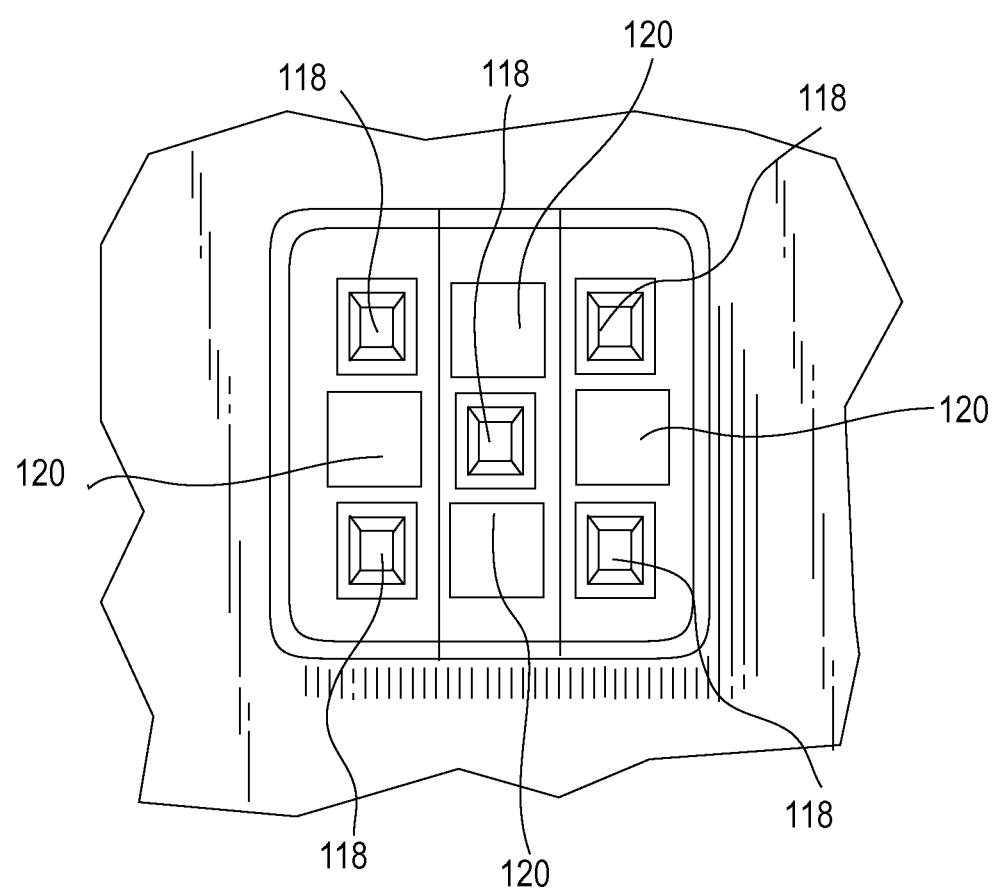
FIG. 18A is an elevational view of yet another alternative LED element that may be used in the luminaire of any of the luminaires disclosed herein.

Referring next to FIGS. 17 and 18, the placement of LEDs on the substrate can be modified to enhance color mixing. FIG. 17 illustrates an embodiment in which the red LEDs 120 are reduced in number to two LEDs 120a, 120b. FIG. 18 illustrates an embodiment wherein the blue shifted yellow LEDs 118 comprise first and second single LEDs 118a, 118c disposed adjacent the edges or sides 114a, 114c and first and second pairs of LEDs 118b1, 118b2 and 118d1, 118d2, adjacent the sides 114b, 114d, respectively. Two red LEDs 120a, 120b are disposed between the LEDs 118 remote from the edges or sides 114. FIG. 18A illustrates an embodiment in which the LEDs 118, 120 are disposed in a checkerboard pattern with the red LEDs 120 being disposed between the blue-shifted LEDs 118.

Figure 32:
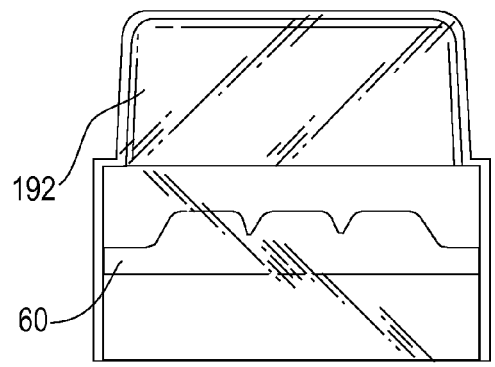
FIG. 32 is a side elevational view of an LED element including a lens.

In addition to the foregoing, the shape or other characteristic of any optics in the path of light may be varied. More particularly, a modified primary or secondary lens 192 (FIG. 32) may be used in conjunction with the LED light source 60 to further improve the luminance and/or color uniformity of the light emitted from the surface of the waveguide. In any embodiment, the primary LED light source lens may be varied and optimized to use refraction or scattering to direct light into preferred directions prior to entering the coupling cavity, thereby improving uniformity. The orientation and/or shape of the LED element relative to the surface(s) defining the coupling cavity may also be varied and optimized to improve light mixing. The lens 192 and/or any of the waveguides disclosed herein may be formed with one or more materials in accordance with the teachings of either U.S. patent application Ser. No. 13/843,928, filed Mar. 15, 2013, entitled "Multi-Layer Polymeric Lens and Unitary Optic Member for LED Light Fixtures and Method of Manufacture" by Craig Raleigh et al., or U.S. patent application Ser. No. 13/843,649, filed Mar. 15, 2013, entitled "One-Piece Multi-Lens Optical Member and Method of Manufacture" by Craig Raleigh et al., the disclosures of which are hereby incorporated by reference herein. If desired, a scatterer, which may be effectuated by scattering particles coated on or formed within the lens 192, may be provided to further mix the light developed by the LEDs.

A conventional hemispherical LED package dome allows direct emission of light developed by LEDs of the package. Particularly, light rays generated from each LED have minimal direction change when such light escapes out of the hemispherical dome, resulting in imaging of the LED to the secondary optic. As a consequence, extra scattering/mixing is typically required when the package includes two or more LEDs, comprising, for example, different or the same color sources.

According to this aspect, a modified primary optic utilizes ribs, straight and/or curved and continuous and/or discontinuous ridges and/or grooves, regularly or irregularly spaced protrusions, depressions, and/or other surface shapes, and/or other light redirection features disposed along either or both of the side(s) and top of the dome and/or extending between a center of the dome and an outer perimeter or surface thereof, with the overall dome shape being symmetric, asymmetric, non-circular, or any other shape. Such a primary optic, which may be made of a TIR material as described herein, encourages more light bounces inside the dome, substantially bends each light ray from its original direction, and results in development of converging light rays that originate from separate LEDs inside the package. Through suitable design of the light redirection features and dome shape, the embodiments disclosed herein take advantage of refraction and TIR occurring around the dome, and function as a light scattering element to break up the package imaging before light developed by the LEDs enters the secondary optic. Because refraction and TIR are generally less light-absorbing than utilizing scattering particles, the optical efficiency for a primary optic modification as contemplated herein can be higher than an approach that uses scattering particles.

An LED package with modified primary optic as disclosed herein may be used in place of any of the light sources disclosed herein, for example, in place of the LED light source 114 of FIG. 33 described hereinafter.

In embodiments shown in FIGS. 36-48, the primary optic dome on an LED package enhances light/color mixing between separate LED sources even before light reaches a secondary optic for beam shaping. Because the modified primary optic is of similar size compared to a traditional LED package dome, the modified primary optic generates a similar far-field emission pattern. Thus, a secondary optic develops a similar intensity distribution with improved color mixing and/or light uniformity. Such a modified primary optic incorporated on a multicolor LED package enables the LED package to be used in a current lighting luminaire originally adapted for use with a monochrome (e.g., pure white) LED module. Such a design modification may result in quicker market adoption for a multicolor LED package, inasmuch as other system components may not require modification to obtain, for example, a warm white illumination.

Figure 36:
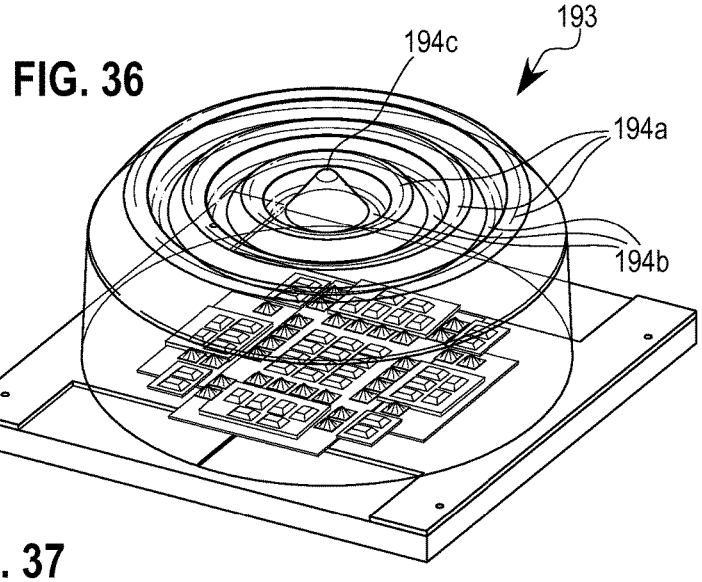
FIG. 36 is an isometric view of an embodiment of a primary optic for an LED package.
Figure 37:
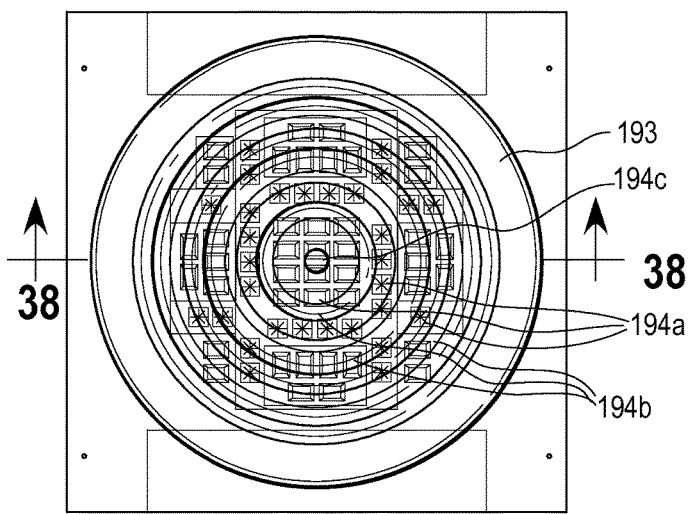
FIG. 37 is a plan view of the primary optic embodiment of FIG. 36.
Figure 38:
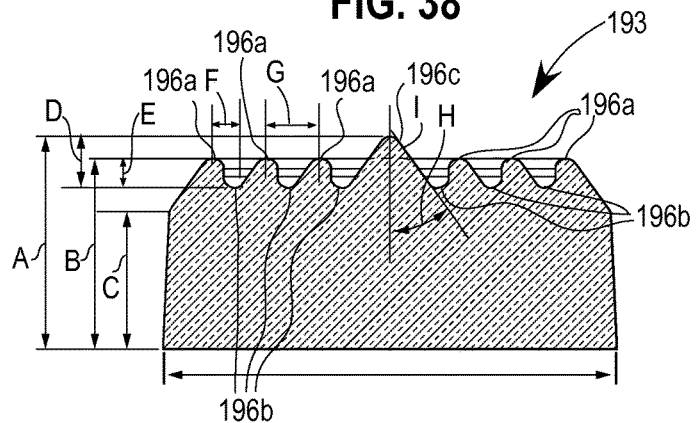
FIG. 38 is a sectional view taken generally along the lines 38-38 of FIG. 37.

An alternative primary optic 193 is shown in FIGS. 36-38. The primary optic is circular when viewed from above and includes spaced ridges 194a separated by intervening troughs 194b and an apex portion 194c. As seen in FIG. 38, the ridges 194a have substantially equal heights and the troughs 194b have substantially equal depths. The apex portion 194c has a height that is greater than the height of the ridges 194a. If desired, as shown by the dashed lines of FIG. 38, the apex portion 196c and the ridges 196a may have equal heights. In some embodiments, it may be preferred to have an increased number and/or height of ridges 196a. As in all of the embodiments of primary optics disclosed herein, the primary optic 193 is made of any suitable optical grade material such as, acrylic, air, molded silicone, polycarbonate, glass, and/or cyclic olefin copolymers, and combinations thereof. Further, the primary optic 193, and the other primary optics disclosed herein, are substantially or completely solid, made of one or more materials (in the latter case the materials may be layered), and mounted atop or otherwise integrated with LEDs of an LED package in any suitable fashion. The ridges 194a, grooves 194b, apex portion 194c, and the overall shape of the primary optic 193 desirably enhance color mixing and emitted light uniformity. Example dimensions as shown in FIG. 38 are provided in greater detail below.

Figure 39:
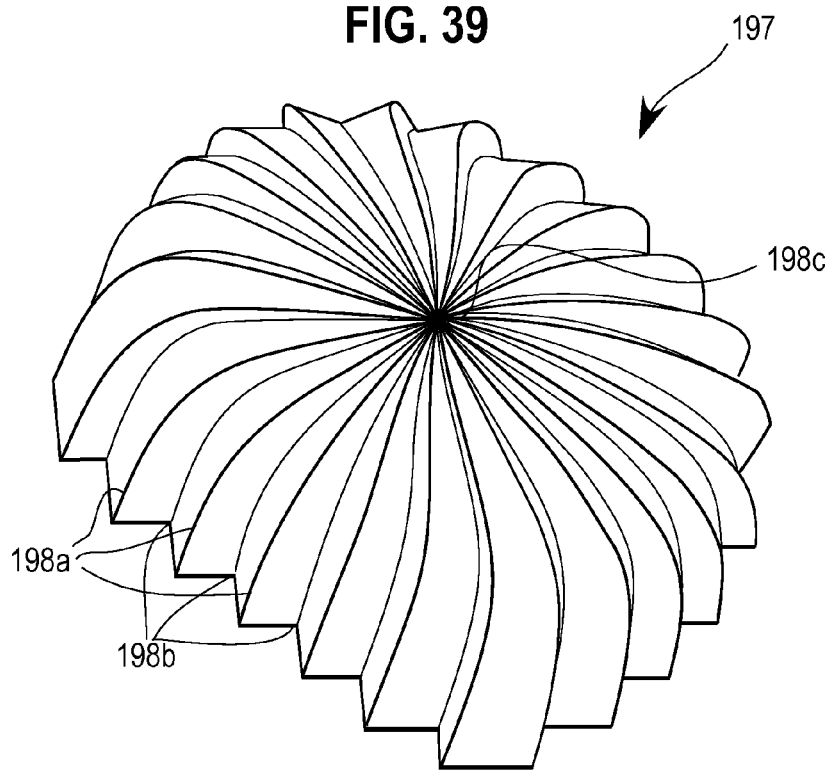
FIG. 39 is an isometric view of yet another alternative primary optic.
Figure 40:
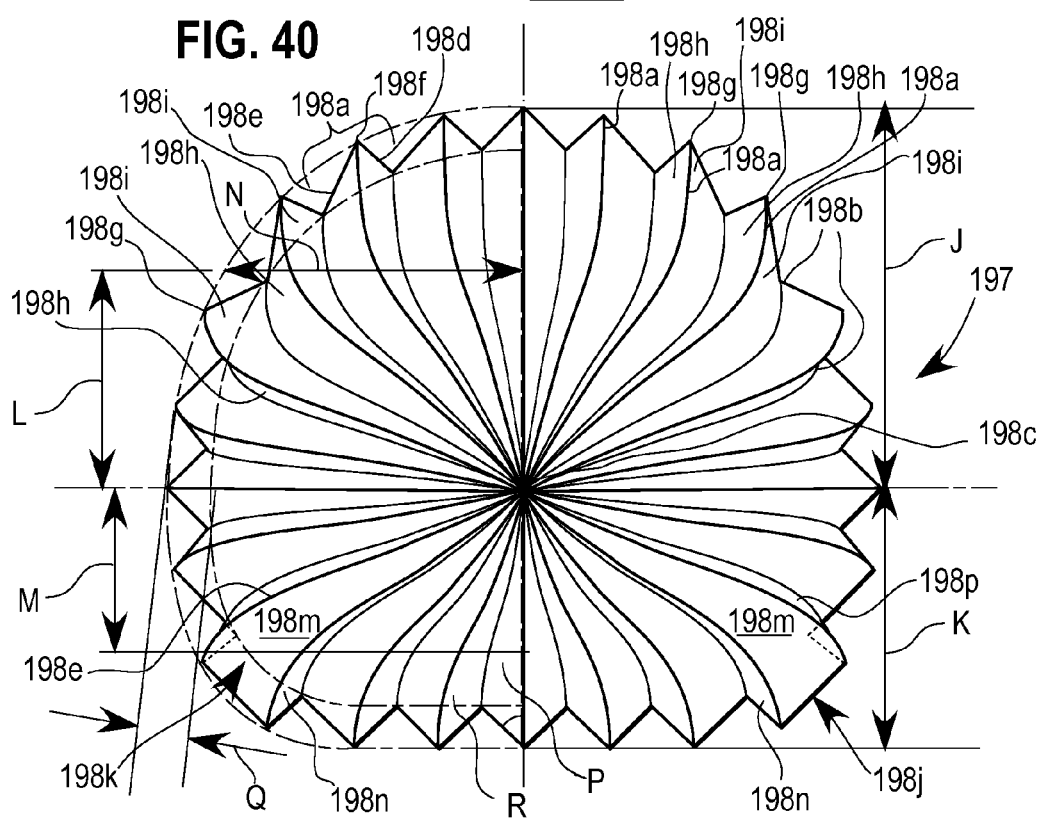
FIG. 40 is a plan view of the primary optic embodiment of FIG. 39.

FIGS. 39 and 40 show yet another embodiment of a primary optic 197 having ridges 198a separated from one another by intervening grooves 198b. The ridges 198a and grooves 198b terminate at a central portion 198c. Each of at least some of the ridges 198a is formed of two surfaces 198d, 198e that form a 90 degree angle at the uppermost junction 198f defining the ridge, although other angles and geometries may used as desired. Four other ridges 198g comprise walls 198h, 198i that are disposed at acute angles less than 90 degrees. Two remaining ridges 198j, 198k comprise an upper wall 198m and side walls 198n and 198p that are disposed at 90 degree angles relative to the upper wall 198h at least where the surfaces 198m, 198n, and 198p intersect a bottom surface of the primary optic as seen in FIG. 40. The ridges are curved and define an S-shape as seen in FIG. 40. The primary optic 197 is D-shaped when viewed from above as seen in FIG. 39. This asymmetry with respect to the central portion 198c contributes to the desirable light mixing implemented by the ridges 198a and grooves 198b.

Figure 41:
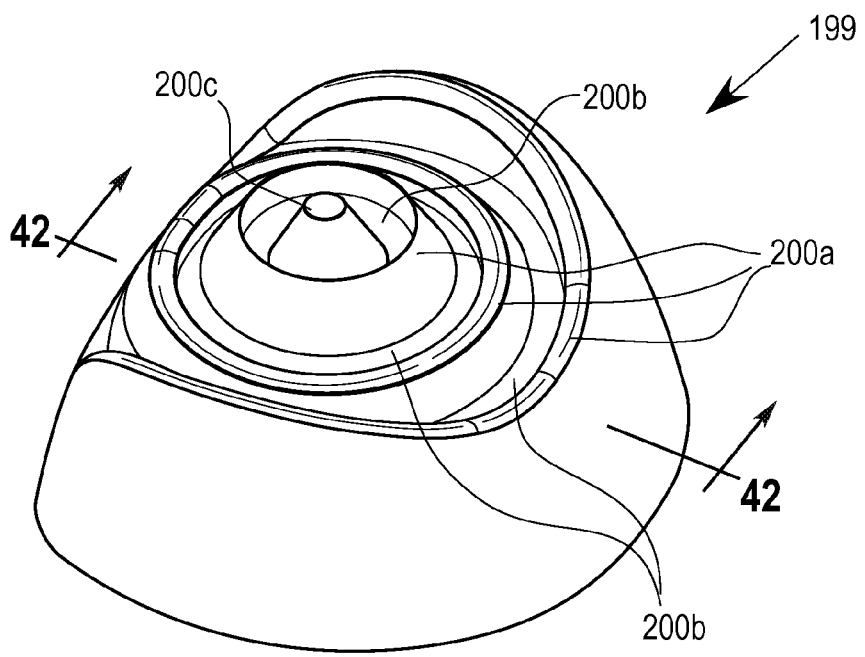
FIG. 41 is an isometric view of still another alternative primary optic for an LED package.
Figure 42:
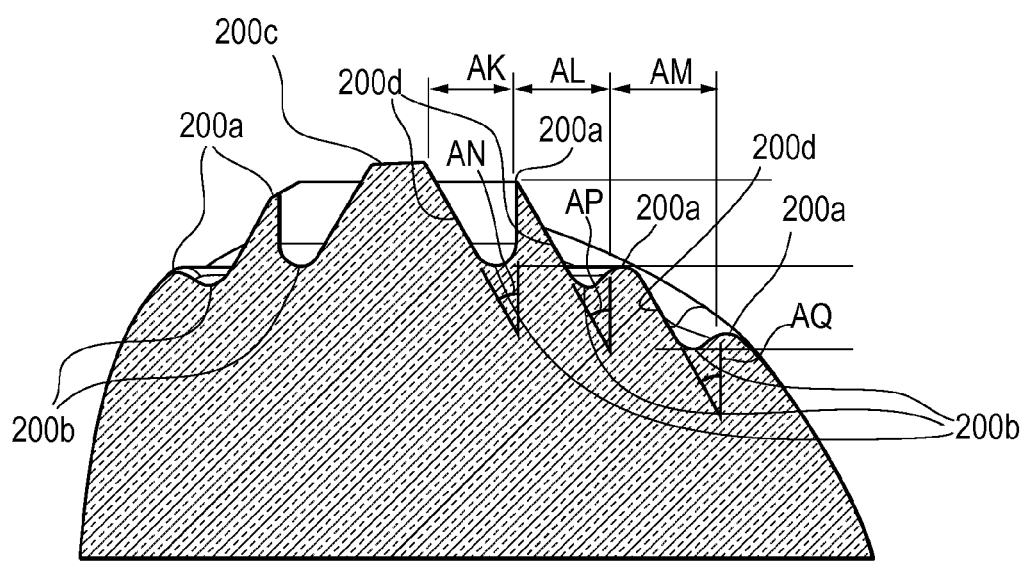
FIG. 42 is a sectional view taken generally along the lines 42-42 of FIG. 41.
Figure 43:
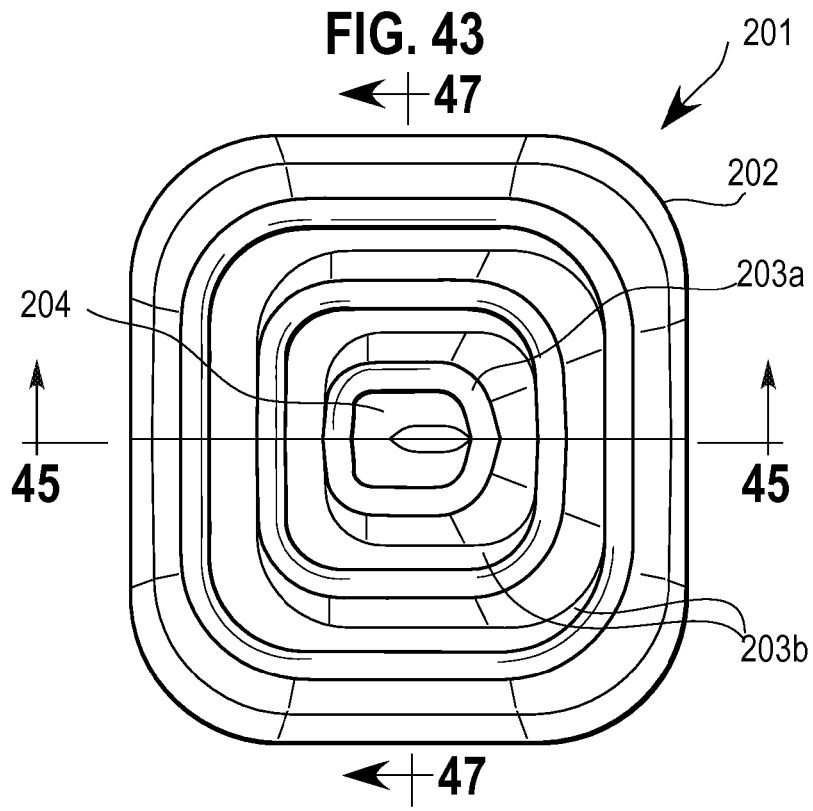
FIG. 43 is an isometric view of another alternative embodiment of a primary optic for an LED package.
Figure 44:
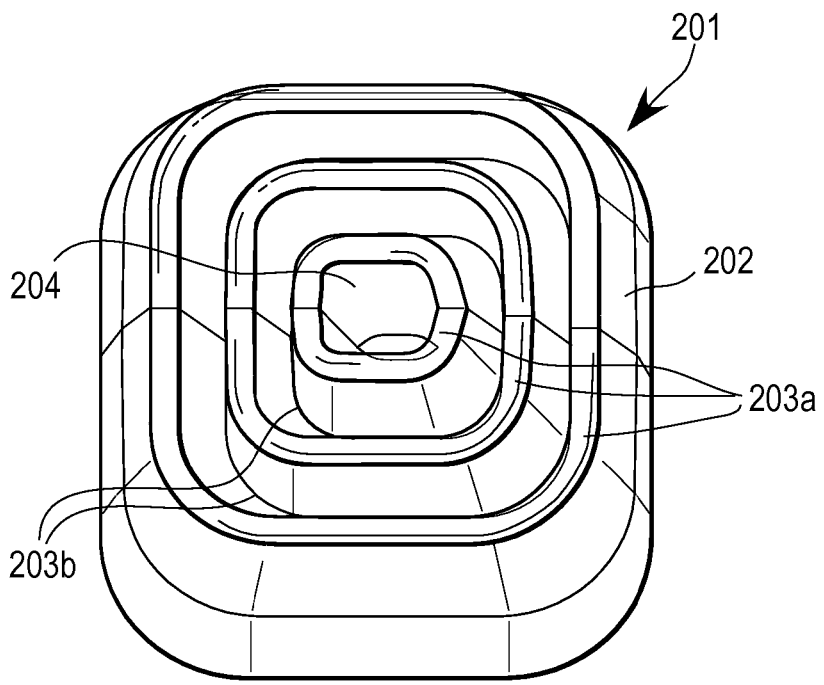
FIG. 44 is a plan view of the primary optic of FIG. 43.

FIGS. 41 and 42 illustrate yet another embodiment of a primary optic 199 having circumferential ridges 200a separated by intervening circumferential grooves 200b and an apex portion 200c. The optic 199 is D-shaped when viewed from above, and is asymmetric when viewed from the side, as seen in FIG. 42. These asymmetries contribute to the desirable light mixing afforded by the ridges 200a, grooves 200b, and apex portion 200c. Each ridge 200a has a surface 200d facing away from the apex portion 200c. In some embodiments, the surfaces 200e of the ridges 200a may be parallel. In other embodiments, the ridges 200a may have varied geometries. Example dimensions as shown in FIG. 42 are provided in greater detail below.

Figure 45:
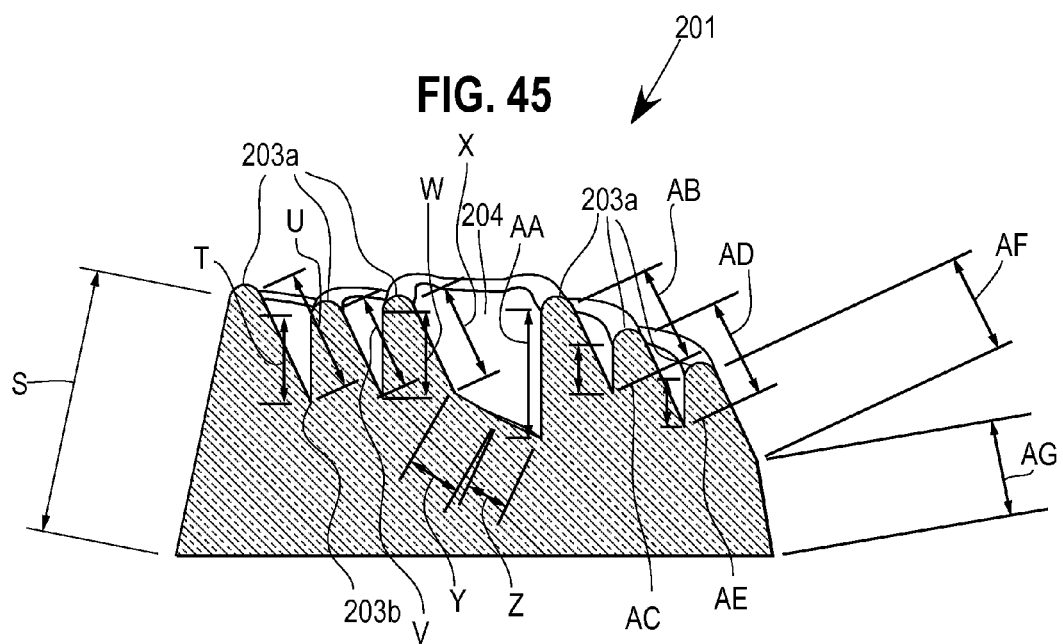
FIGS. 45 and 46 are identical cross sectional views taken generally along the lines 45-45 of FIG. 44.
Figure 46:
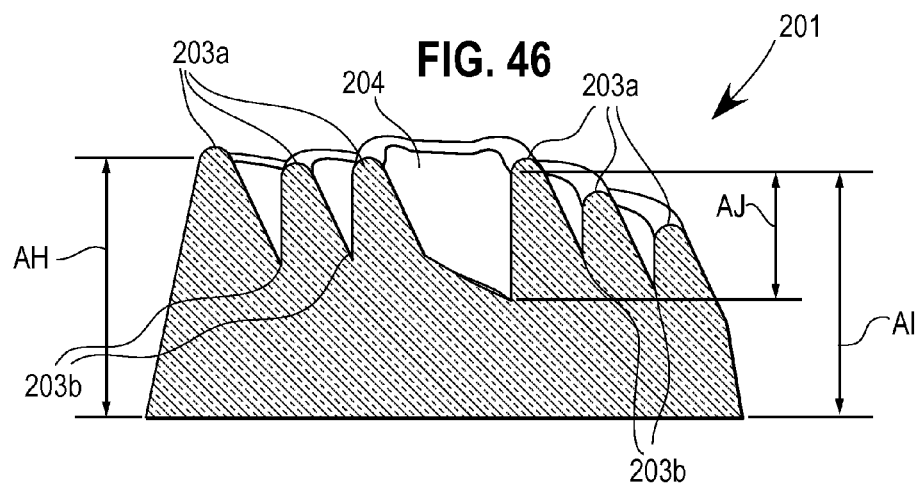
Figure 47:
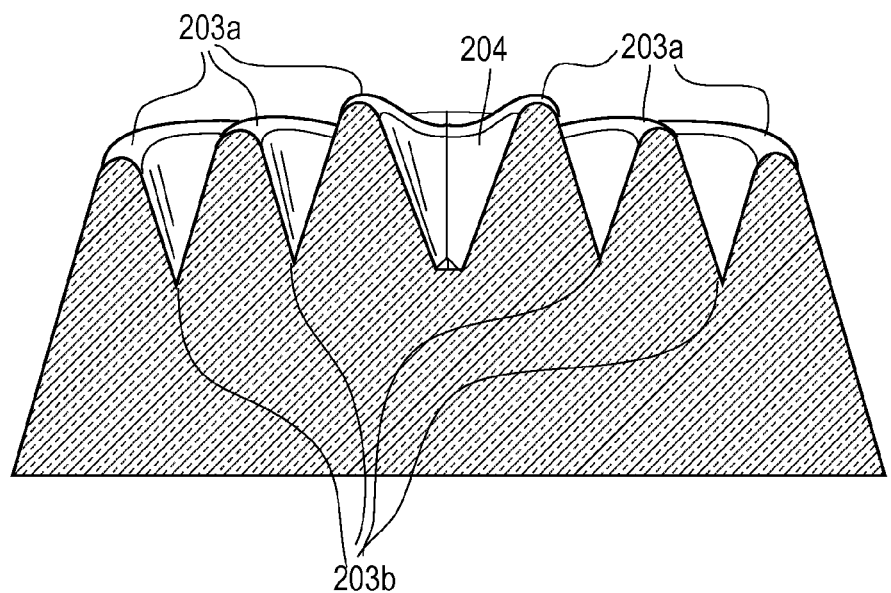
FIG. 47 is a cross sectional view taken generally along the lines 47-47 of FIG. 44.

Referring next to FIGS. 43-47, a still further embodiment of a primary optic 201 includes a body 202 of substantially square or other shape with rounded corners and having ridges 203a separated by intervening grooves 203b. The body 202 further includes a central recess 204. The body 202 is asymmetric in cross section as seen in FIG. 45 and this asymmetry contributes to the desirable light mixing afforded by the ridges 203a, grooves 203b, and walls defining the central recess 204. Example dimensions as shown in FIGS. 45 and 46 are provided in greater detail below.

Figure 48:
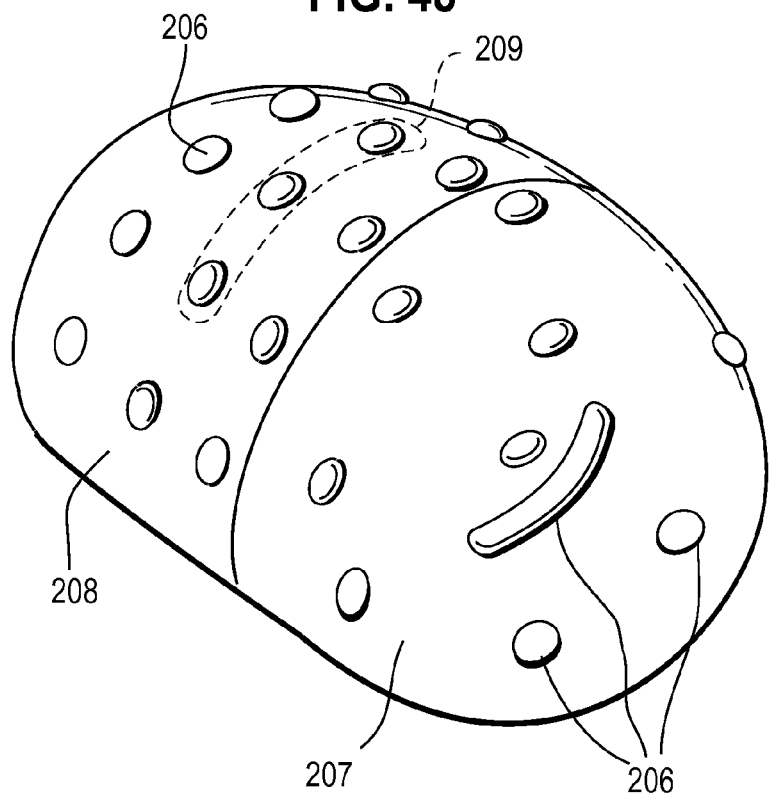
FIG. 48 is an isometric view of yet another alternative embodiment of a primary optic for an LED package.

FIG. 48 illustrates that the primary optic may include bumps or protrusions 206 that may or may not be separated by intervening depressions. The bumps or protrusions 206 may be of any shape (different or the same) as seen in FIG. 48, may be irregularly spaced as seen at 207 or may be regularly spaced as seen at 208. If desired, the bumps or protrusions 206 may comprise portions of a discontinuous upstanding member, such as one or more discontinuous ridges, for example, as seen at 209 in FIG. 48 etc., each of which may be straight, curved, or some other shape. More generally, one or more features could be included having at least one of a positive inflection and a negative inflection to promote light mixing. The features may be regularly spaced or irregularly spaced, they may be of the same shape and/or size or or different shapes and/or sizes, they may comprise protrusions, depressions, bumps, ridges, grooves or other elements, as desired. In an embodiment, such features may have a semicircular dimension with a radius ranging from about 0.2 mm up to about half of the maximum dimension of the primary optic. In any or all embodiments the LED package may include one or more LED chips that are the same or different colors, and may be phosphor converted LEDs, such as blue shifted yellow, and non-phosphor converted LEDs, such as red LEDs. The primary optic can help mix the light from the different sources to remove pixilation and in some embodiments mix color.

In particular examples, the primary optics disclosed herein may have the dimensions noted in the following table and as seen in FIGS. 38, 40, 42, 45, and 46. It should be noted that the dimensions in the following table as exemplary only and not limiting:

TABLE 1

| | NOMINAL DIMENSION (Millimeters - unless otherwise specified) |
|---|---|
| FIG. 38 | |
| A | 3.86 |
| B | 3.47 |
| C | 2.5 |
| D | 0.92 |
| E | 0.553 |
| F | 0.40 |
| G | 0.60 |
| H | 35 degrees |
| I | 0.20 radius of curvature |

TABLE 1-continued

NOMINAL DIMENSION
(Millimeters - unless
otherwise specified)

| | |
|---|---|
| FIG. 40 | |
| J | 4.57 |
| K | 3.05 |
| L | 2.66 |
| M | 1.93 |
| N | 3.53 |
| P | 3.87 |
| Q | 0.51 |
| R | 45 degrees |
| FIG. 42 | |
| AK | 0.89 |
| AL | 0.89 |
| AM | 1.02 |
| AN | 30 degrees |
| AP | 30 degrees |
| AQ | 30 degrees |
| FIG. 45 | |
| S | 3.32 |
| T | 1.10 |
| U | 1.53 |
| V | 1.23 |
| W | 1.08 |
| X | 1.23 |
| Y | 0.69 |
| Z | 0.55 |
| AA | 1.60 |
| AB | 1.20 |
| AC | 0.61 |
| AD | 1.23 |
| AE | 0.61 |
| AF | 1.23 |
| AG | 1.21 |
| FIG. 46 | |
| AH | 3.25 |
| AI | 3.07 |
| AJ | 1.47 |

Figure 19:
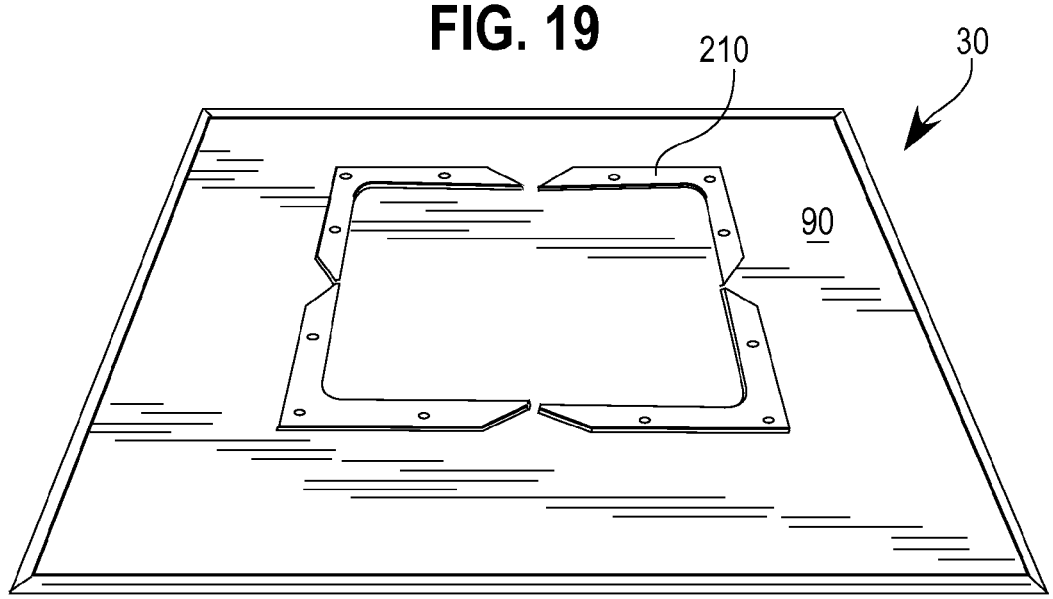
FIGS. 19 and 20 are isometric and elevational views, respectively, of the luminaire of FIG. 1 utilizing a masking element.
Figure 20:
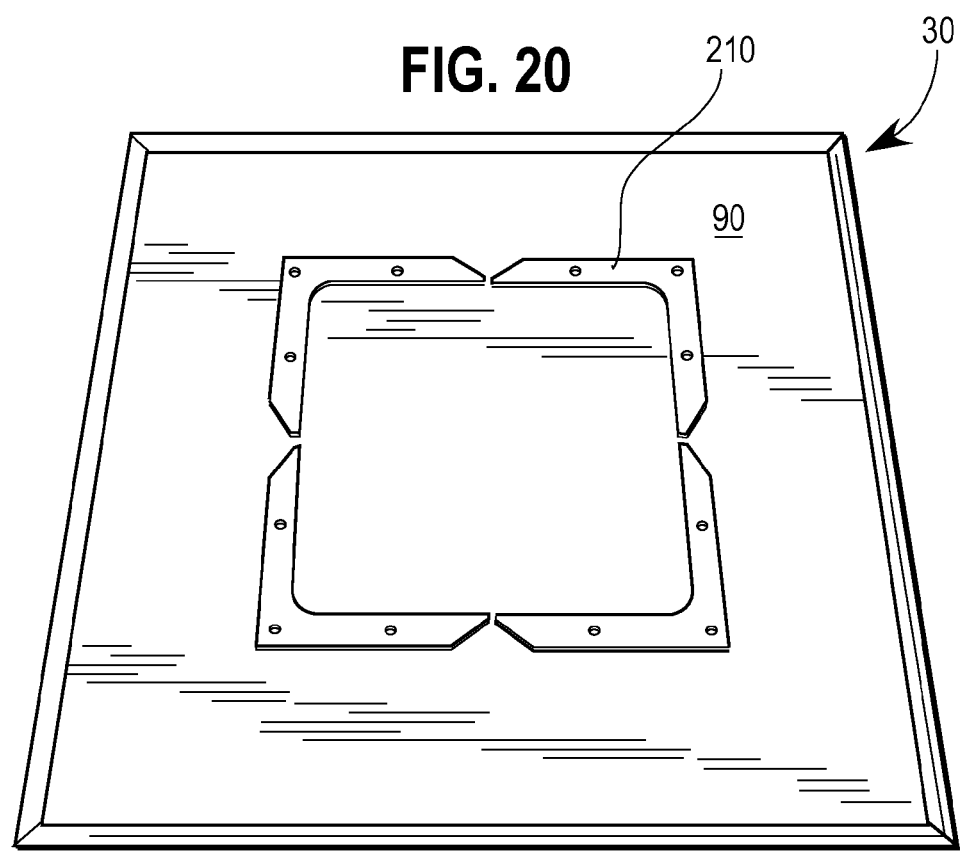

Non-uniform illuminance by the luminaire 30 may be addressed by securing a masking element 210 to the diffuser 90 to obscure bright spots, as seen in FIGS. 19 and 20. The masking element 210 may have any desired shape, may comprise single or multiple sub-elements, and/or may be translucent or opaque. The masking element may be made of any desired material, and should minimize the absorption of light.

In the illustrated embodiment, the light emitted out the waveguide body is mixed such that point sources of light in the source 60 are not visible to a significant extent and the emitted light is controlled to a high degree. The interface between the coupling cavity and the waveguide as described above also results in obscuring discrete point sources.

Further, it may be desirable to redirect light within the waveguide to provide better luminance uniformity from discrete light sources, and/or to provide mixing of colors from multi-color sources. In addition to any or all of the features and embodiments disclosed herein, a waveguide may include internal redirection features that implement scattering, reflection, TIR, and/or refraction to redirect the light within the waveguide body. The spacing, number, size and geometry of redirection features determine the mixing and distribution of light within the waveguide. In some circumstances, the redirection feature may be designed such that some of the light is directed out of, i.e. extracted from, the waveguide body as well.

In one embodiment, the waveguide may include one or more extraction features on the one or more external faces to direct light out of the body, and one or more internal redirection features to redirect light within the body. In general, light reflected off of the extraction features travels relatively directly to the external surface, whereas light reflected off of the redirection features travels some distance within the waveguide before exiting through the external surface. Such redirection within the body of the waveguide is referred to hereinafter as occurring "in-plane." In-plane redirection causes the light ray to be extracted from the waveguide at a modified, laterally-displaced extraction point, in contrast to the original or unaltered extraction point at which the light ray would have otherwise been extracted. The modified extraction point is preferred to the unaltered extraction point as the in-plane redirection enhances color uniformity within the body.

Figure 21:
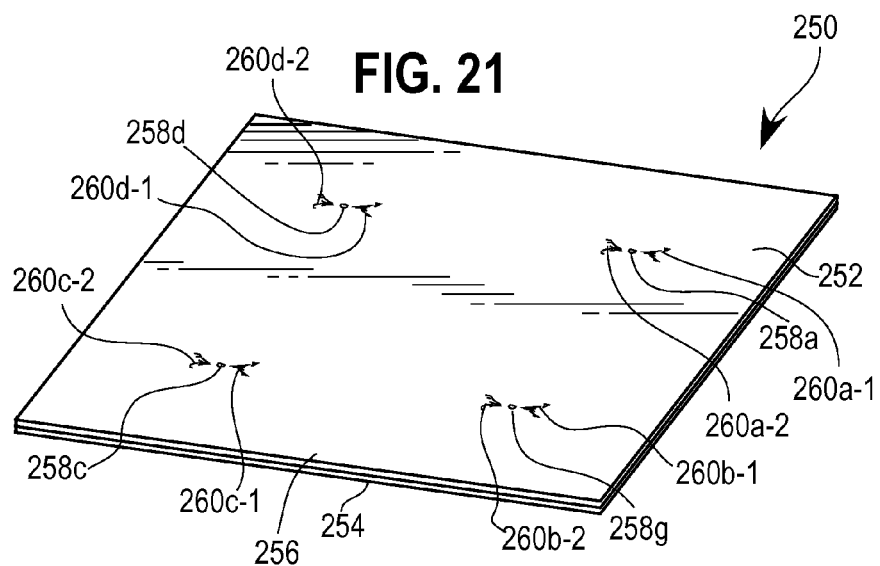
FIG. 21 is an isometric view of a waveguide having redirection features.

Referring to FIG. 21, a waveguide 250 may comprise a body 252 exhibiting a total internal reflectance characteristic and having a first external face 254 and a second external face 256 opposite the first external face 254. One or more coupling cavities or recesses 258 extends between and is preferably (although not necessarily) fully disposed between the first and second external faces 254, 256, and is adapted to receive a light source 259 (shown in FIG. 27). As in previous embodiments the light source 259 may include one or more LEDs that are configured to direct light into the waveguide body 252. A plug member (as in the previous embodiments, not shown in FIG. 21) may be used to direct light emitted by the LED(s) into the waveguide body 252. The waveguide body 252 also includes one or more redirection features 260a, 260b, 260c, 260d configured to redirect light emitted from the LED(s) in-plane.

Figure 22:
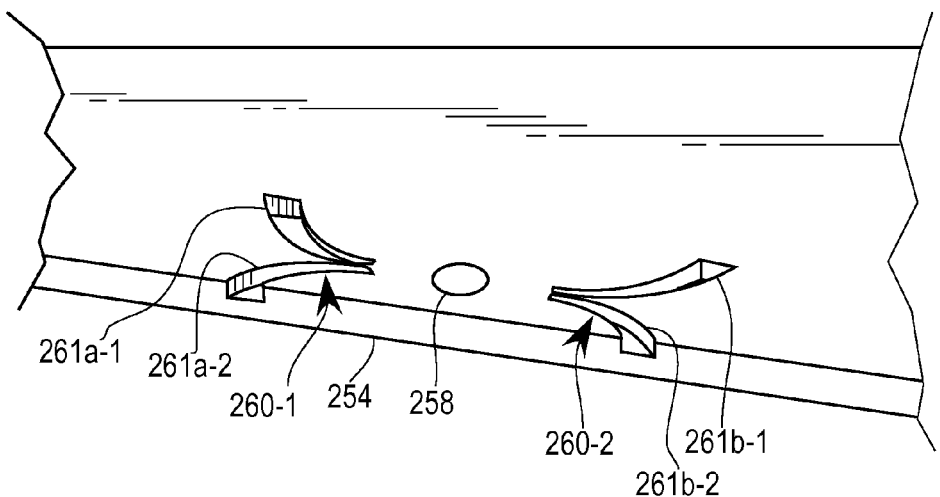
FIG. 22 is an enlarged, fragmentary, isometric view of the redirection features of the waveguide of FIG. 21.

As shown in FIG. 22, the redirection feature 260 is preferably at least partially or fully internal to the waveguide body 252 and comprises surfaces defining two opposing arcuate voids 261-1, 261-2 extending along the planar direction. The redirection feature 260 preferably, although not necessarily, has a substantially constant thickness (i.e., depth) of about 1 mm and either or both of the voids 261 may be filled with air, acrylic, an acrylic material including scattering particles, polycarbonate, glass, molded silicone, a cyclic olefin copolymer, or another material having an index of refraction different than or the same as the index of refraction of the remainder of the waveguide body 252, or combinations thereof.

Figure 23:
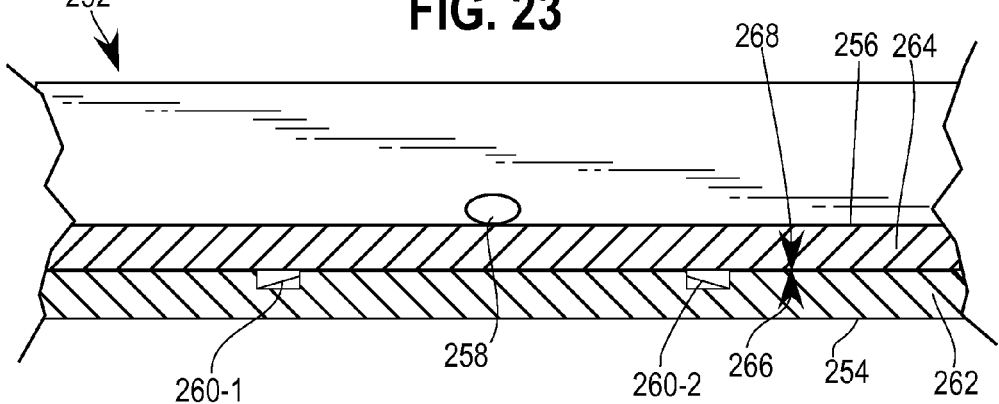
FIG. 23 is an enlarged, isometric view of the waveguide of FIG. 21 with a portion broken away.

Shown most clearly in FIG. 23, the body 252 is comprised of a first plate 262 and a second plate 264 bonded or otherwise secured to one another, wherein the first and second plates 262, 264 include the first and second external faces 254, 256, respectively. The coupling cavity 258 is formed in and extends into at least one of the first and second plates 262, 264 and may comprise any fraction of the thickness of the waveguide body from about 1% or less to 100% of such thickness. The first and second plates 262, 264 are optically transmissive bodies, and may be made of the same or different materials. Both of the first and second plates 262, 264 exhibit a total internal reflection characteristic. The first plate 262 includes a first internal face 266 opposite the first external face 254, and the second plate 264 includes a second internal face 268 opposite the second external face 256. The second internal face 268 of the second plate 264 is maintained in contact with the first internal face 266 of the first plate 262. In the illustrated embodiment the redirection feature 260 is formed by any suitable manufacturing process extending into the first plate 262 from the first internal face 266. Alternatively, in any of the embodiments disclosed herein, the redirection feature 260 may extend into the second plate 264 from the second internal face 268 or portions of the redirection feature 260 may extend into both plates 262, 264 from the faces 266, 268, as should be evident. In this last case, the portions of the redirection feature 260 may be partially or fully aligned with one another, as necessary or desirable.

FIGS. 24 and 25 illustrate an embodiment wherein the waveguide body 252 includes first alternative redirection features 272 each having a triangular cross-sectional shape associated with the first plate 262. Further, the waveguide body 252 may include one or more extraction features 274 on the first and second external faces 254, 256 to direct light out of the body 252. The internal redirection features 272 may also extract light out of the waveguide body 252 as well. A further redirection feature 278 may be embossed or otherwise associated with the second internal face 268 of the second plate 264.

Referring to FIG. 26, the redirection feature 272 is embossed, molded, screen printed, machined, laser-formed, laminated, or otherwise formed and disposed on the first internal face 266 of the first plate 262, and the first internal face 266 of the first plate 262 is thereafter secured to the second internal face 268 of the second plate 264. In any of the embodiments such securement may be accomplished by applying a solvent to one of the internal faces that chemically reacts with the waveguide body material to promote adhesion, and then pressing the internal faces together. Alternatively, the surfaces may be bonded through the application of high pressure and heat, or an adhesive material may be disposed between the surfaces. Other fabrication methods, such as through the use of a three-dimensional printer, are envisioned. Still further, other structures are within the scope of the present invention, including a film or other member having a portion having a first index of refraction and formed by any suitable methodology, such as those noted above (embossing, molding, screen printing, etc.), and sandwiched between two members both having a second index of refraction different than the first index of refraction. A further alternative comprehends a film or other structure disposed between two other members, wherein the film or other structure has a first index of refraction, a first of the two members has a second index of refraction and the other of the two members has a third index of refraction wherein the first, second, and third indices of refraction are different or where the film or other structure comprises an index-matching material.

As shown in FIG. 27, second and third alternative redirection features 282, 284 may extend from the coupling cavity 258 in a radial direction. Second alternative redirection features 282 have a rectangular shape, and third alternative redirection features 284 have a V-shape in plan view. It has been found that radially-extending redirection features are especially useful in promoting mixing of light emitted by an LED element having multiple LEDs distributed in spaced relation on a substrate such that at least some of the LEDs are disposed off-axis, i.e., such LEDs are offset from the center of the cavity in which the LED element is disposed. Specifically, light rays 280 emitted from the LEDs are reflected off of the redirection features 282, 284 due, for example, to total internal reflection, in different directions within the waveguide body 252.

One or more other light redirection feature shapes could be used, such as circular, diamond-shaped (seen in FIG. 28A), kite-shaped (i.e., a diamond shape with different angles at opposing ends of the shape), rectangular, polygonal, curved, flat, tapered, segmented, continuous, discontinuous, symmetric, asymmetric, etc. The light redirection feature preferably has an overall radial length of no less than about 1 um, and more preferably the overall radial length is between about 10 um and about 10 mm, and most preferably between about 1 mm and about 10 mm. Further the light redirection feature preferably has an overall circumferential extent of no less than about 1 um, and more preferably the overall circumferential extent is between about 10 um and about 10 mm, and most preferably between about 1 mm and about 10 mm. Any or all of the surfaces partially or fully defining any or all of the features disclosed herein, including the light redirection features disclosed herein, or any portion thereof, may be coated or otherwise formed with optically reflective materials, such as a specular material, such as a metallized coating, a scattering material, a white material, or the like, if desired.

It should be noted that the number, size, and arrangement of the light redirection features may be such as to gradually collimate light over the extent of the waveguide body and/or could cause redirection of light for another purpose, for example, to cause the light to avoid features that would otherwise absorb or scatter such light.

Figure 31:
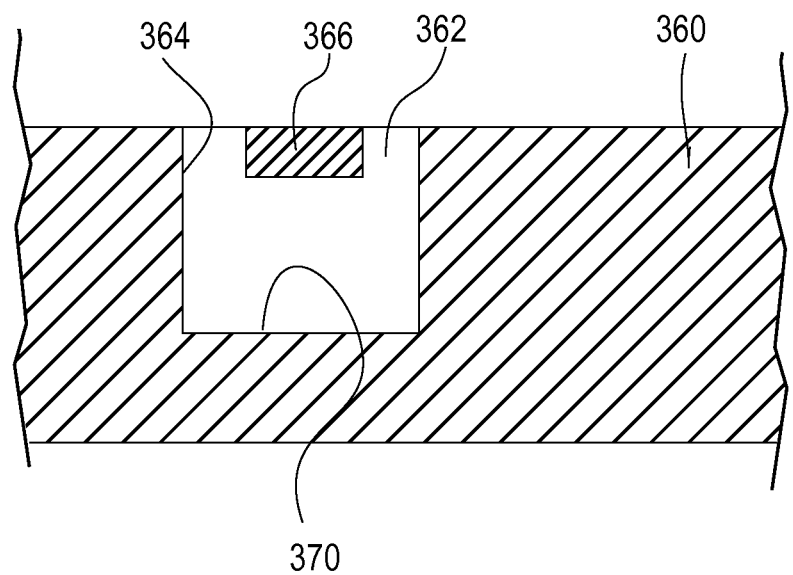
FIG. 31 is a fragmentary sectional view according to still another embodiment.

As seen in FIG. 31, a waveguide body 360 includes a coupling cavity 362 defined by a surface 364 and an LED element 366 extends into the cavity 362. In an illustrated embodiment, the cavity 362 does not extend fully through the waveguide body 360, and instead comprises a blind bore that terminates at a planar base surface 370 that comprises a light diverter. It should be noted that the surface 364 need not be circular cylindrical in shape as seen in FIG. 31; rather, the surface 364 may comprise a plurality of light coupling features in the form of facets or other shaped surfaces. In addition, the planar base surface 370 may also be replaced by other shaped surfaces, such as a conical surface (either convex or concave) or planar, segmented sections that taper to a point coincident with a central axis of the cavity 362. This embodiment is particularly adapted for use with relatively thin waveguide bodies. Also, the planar base surface 370 may be coated with a reflective material, such as a white or specular material as noted above with respect to the plug member.

Still further, the surface 364 (and/or any of the embodiments disclosed herein) may comprise an elongate light coupling cavity or portion, i.e., a cavity or portion that is not fully circular cylindrical, but at least a portion of the cavity or portion is instead another shape, such as elliptical, oval, racetrack-shaped, teardrop-shaped, symmetric or asymmetric, continuous or segmented, etc.

Figure 28:
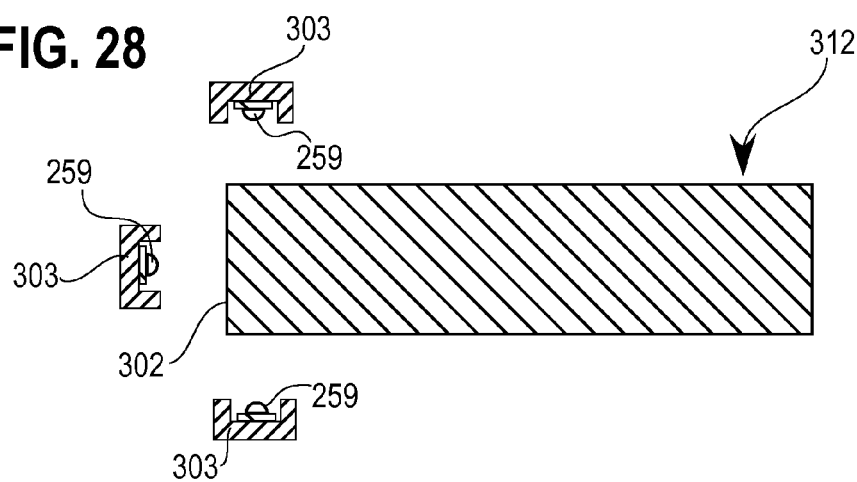
FIG. 28 is a diagrammatic fragmentary side elevational view of a further embodiment.
Figure 28A:
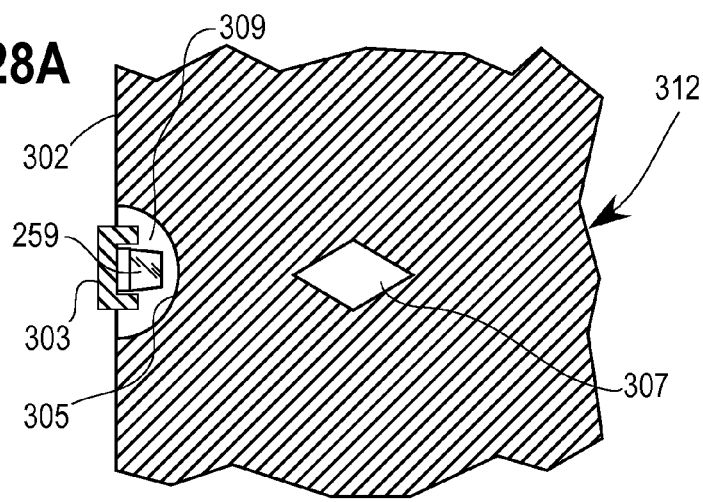
FIG. 28A is a diagrammatic plan view of the embodiment of FIG. 28.

FIGS. 28 and 28A illustrate generally that the LED light source 259 need not be located at one or more interior portions of a waveguide body (such an arrangement can be referred to as an interior lit waveguide), it being understood that, as shown, the LED light source 259 may be adjacent or in an edge 302 of the waveguide body to obtain either an edge lit waveguide or an end lit waveguide, as described below. In edge lit embodiments, the light source 259 may be above, below, and/or to the side of the edge 302 and aligned therewith (as seen in FIG. 28). The waveguide body preferably includes at least one coupling feature 305 (FIG. 28A) defining a coupling cavity 309, and, if desirable, at least one redirection feature 307 (also seen in FIG. 28A) extending away from the coupling cavity 309 and the LED light source 259 as disclosed in the previous embodiments. A reflecting cover or member 303 may be disposed over, under or otherwise adjacent to the light source 259 in any of the embodiments disclosed herein, including the embodiment of FIG. 28, if desired.

Figure 29:
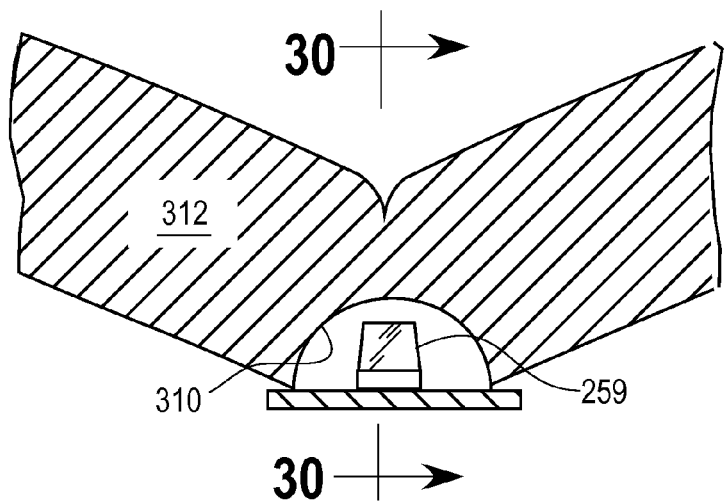
FIG. 29 is an isometric view of a waveguide according to yet another embodiment.
Figure 30:
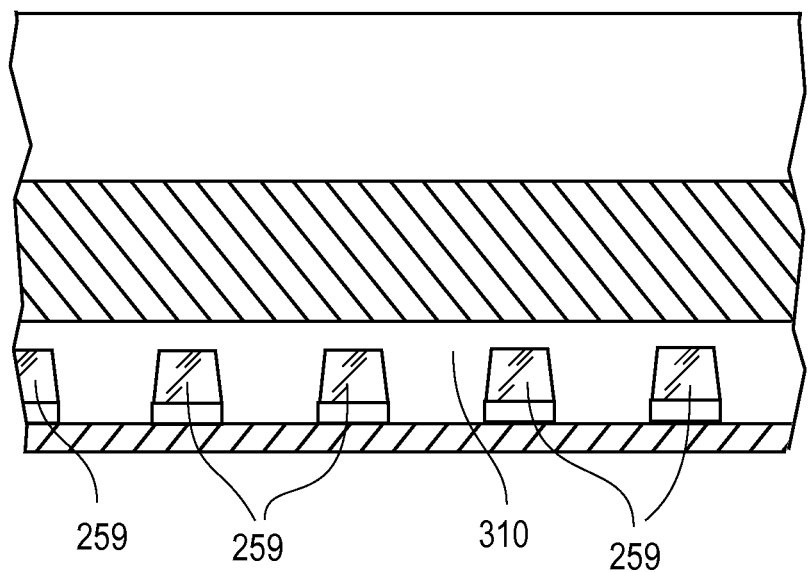
FIG. 30 is a sectional view taken generally along the lines 30-30 of FIG. 29.

A combined interior lit and edge lit waveguide (also referred to as an end lit waveguide) may be obtained by providing coupling features at interior portions and edge(s) of the waveguide. Specifically, FIGS. 29 and 30 illustrate an embodiment in which one or more light sources 259 are disposed adjacent an elongate coupling section or portion 310 of a coupling optic 312. The coupling section 310 includes at least one coupling feature and, if desired, at least one redirection feature as in the embodiments described above.

Figure 33:
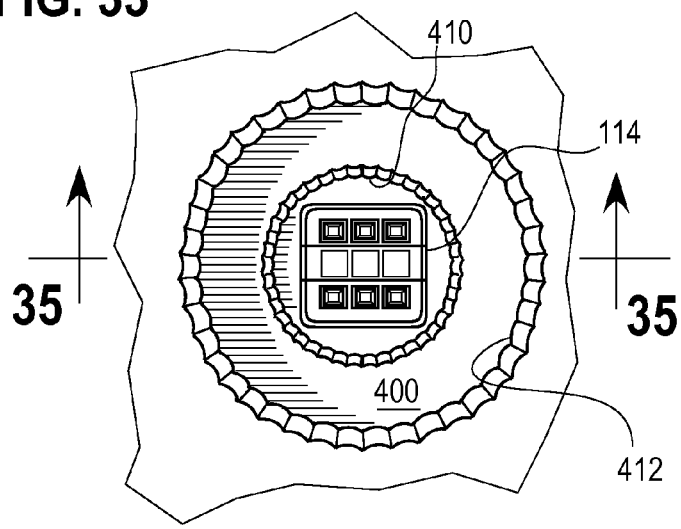
FIG. 33 is a plan view of a further alternative coupling cavity.

Referring next to FIG. 33, an alternate noncircular coupling cavity 400 is formed by any suitable methodology in any of the waveguide bodies disclosed herein (the coupling cavity 400 is noncircular in the sense that the surfaces defining the cavity 400, at least where light enters the waveguide body, do not define a smooth circle). The coupling cavity 400, which may comprise a blind cavity or a cavity that extends fully through the waveguide body, includes one or more coupling features in the form of a circumferential array of inwardly directed surfaces, shown as bumps or protrusions 402. The bumps or protrusions 402, each of which may comprise curved, planar, and/or other-shaped surfaces, promote mixing of light by providing surfaces at varying angles with respect to incident light rays developed by an LED light source 114. In the event that the coupling cavity extends fully through the waveguide body, a light diverter (not shown) may be provided opposite the LED light source 114, as in previous embodiments.

Figure 34:
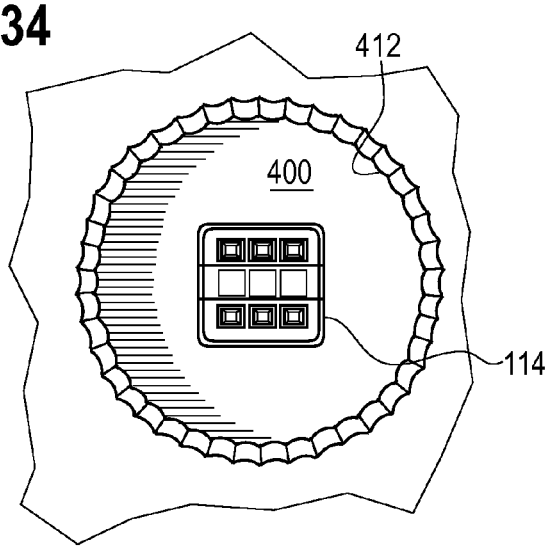
FIG. 34 is a plan view of yet another alternative coupling cavity.
Figure 35:
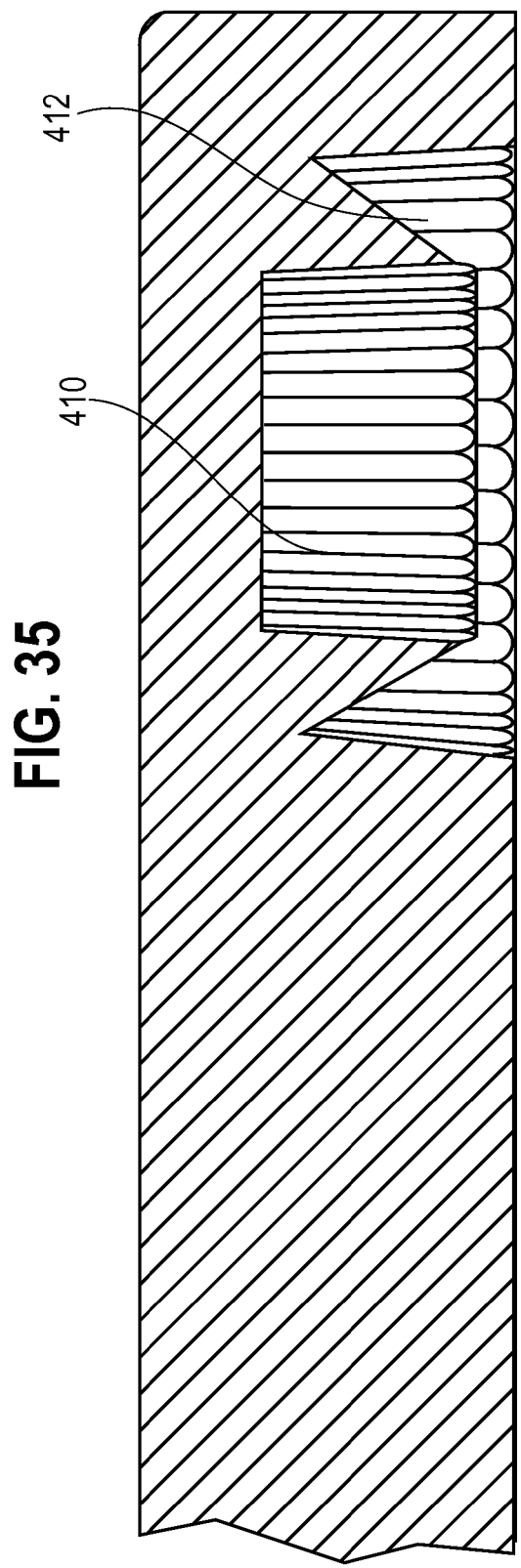
FIG. 35 is a sectional view taken generally along the lines 35-35 of FIG. 33.

FIGS. 34 and 35 illustrate an embodiment identical to that shown in FIG. 33, except that the single circumferential array of inwardly directed curved surfaces are replaced by one or more coupling features comprising first and second circumferential arrays of surfaces comprising bumps or protrusions generally indicated at 410, 412. As seen in FIG. 35, the first array of bumps or protrusions 410 is axially shorter than the second array of bumps or protrusions 412. Further, the first array of bumps or protrusions 410 is disposed radially inside the second array of bumps or protrusions 412 and is coaxial therewith. Light developed by an LED light source 114 is efficiently mixed by the arrays 410, 412.

In any of the embodiments disclosed herein, gaps or interfaces between waveguide elements may be filled with an optical coupling gel or a different optical element or material, such as an air gap.

INDUSTRIAL APPLICABILITY

In summary, it has been found that when using a single color or multicolor LED element in a luminaire, it is desirable to mix the light output developed by the LEDs thoroughly so that the intensity and/or color appearance emitted by the luminaire is uniform. When the LED element is used with a waveguide, opportunities have been found to exist to accomplish such mixing during the light coupling and light guiding or distributing functions. Specifically, bending the light rays by refraction can result in improvement in mixing. In such a case, this refractive bending can be accomplished by providing interfaces in the waveguide between materials having different indices of refraction. These interfaces may define coupling features where light developed by the LED elements enters the waveguide and/or light redirection features at portions intermediate the coupling features and waveguide extraction features or areas where light is otherwise extracted (such as by bends) from the waveguide. It has further been found that directing light into a wide range of refraction angles enhances light mixing. Because the angle $A_r$ of a refracted light ray is a function of the angle $A_i$ between the incident light ray and the interface surface struck by the incident light ray (with refractive angle $A_r$ increasing as $A_i$ approaches zero, i.e., when the incident light ray approaches a parallel condition with respect to the interface surface), a wide range of refracted light ray angles can be obtained by configuring the interface surfaces to include a wide range of angles relative to the incident light rays. This, in turn, means that the interfaces could include a significant extent of interface surfaces that are nearly parallel to the incident light rays, as well as other surfaces disposed at other angles to the incident light rays. Overall waveguide shapes and coupling feature and redirection feature shapes such as curved (including convex, concave, and combinations of convex and concave surfaces), planar, non-planar, tapered, segmented, continuous or discontinuous surfaces, regular or irregular shaped surfaces, symmetric or asymmetric shapes, etc. can be used, it being understood that, in general, light mixing (consistent with the necessary control over light extraction) can be further improved by providing an increased number of interface surfaces and/or more complex interface shapes in the light path. Also, the spacing of coupling features and light redirection features affect the degree of mixing. In some embodiments a single light coupling feature and/or a single light redirection feature may be sufficient to accomplish a desired degree of light mixing. In other embodiments, multiple coupling features and/or multiple light redirection features might be used to realize a desired degree of mixing. In either event, the shapes of multiple coupling features or multiple redirection features may be simple or complex, they may be the same shape or of different shapes, they may be equally or unequally spaced, or distributed randomly or in one or more arrays (which may themselves be equally or unequally spaced, the same or different size and/or shape, etc.) Further, the interfaces may be disposed in a symmetric or asymmetric pattern in the waveguide, the waveguide itself may be symmetric or asymmetric, the waveguide may develop a light distribution that is symmetric, asymmetric, centered or non-centered with respect to the waveguide, the light distribution may be on-axis (i.e., normal to a face of the waveguide) or off-axis (i.e., other than normal with respect to the waveguide face), single or split-beam, etc.

Still further, one or more coupling features or redirection features, or both, may be disposed anywhere inside the waveguide, at any outside surface of the waveguide, such as an edge surface or major face of the waveguide, and/or at locations extending over more than one surface or portion of the waveguide. Where a coupling or light redirection feature is disposed inside the waveguide, the feature may be disposed in or be defined by a cavity extending fully through the waveguide or in or by a cavity that does not extend fully through the waveguide (e.g., in a blind bore or in a cavity fully enclosed by the material of the waveguide). Also, the waveguide of any of the embodiments disclosed herein may be planar, non-planar, irregular-shaped, curved, other shapes, suspended, a lay-in or surface mount waveguide, etc.

While specific coupling feature and light redirection feature parameters including shapes, sizes, locations, orientations relative to a light source, materials, etc. are disclosed as embodiments herein, the present invention is not limited to the disclosed embodiments, inasmuch as various combinations and all permutations of such parameters are also specifically contemplated herein. Thus, any one of the coupling cavities, plug members, LED elements, masking element(s), redirection features, extraction features, etc. as described herein may be used in a luminaire, either alone or in combination with one or more additional elements, or in varying combination(s) to obtain light mixing and/or a desired light output distribution. More specifically, any of the features described and/or claimed in U.S. patent application Ser. No. 13/842,521, U.S. patent application Ser. No. 13/839,949, U.S. patent Ser. No. 13/841,074, filed Mar. 15, 2013, entitled "Optical Waveguide Body", U.S. patent application Ser. No. 13/840,563, U.S. patent application Ser. No. 14/101,099, entitled "Optical Waveguide Assembly and Light Engine Including Same" by Zongjie Yuan et al., filed Dec. 9, 2013, U.S. patent application Ser. No. 14/101,132, filed Dec. 9, 2013, "Waveguide Bodies Including Redirection Features and Methods of Producing Same", U.S. patent application Ser. No. 14/101,147 entitled "Luminaires Using Waveguide Bodies and Optical Elements", filed Dec. 9, 2013,U.S. patent application Ser. No. 14/101,129, entitled "Simplified Low Profile Module With Light Guide For Pendant, Surface Mount, Wall Mount and Stand Alone Luminaires" by Eric J. Tarsa et al., filed Dec. 9, 2013, U.S. Patent Application Ser. No. 61/922,017, entitled "Optical Waveguide Bodies and Luminaires Utilizing Same" by John Durkee et al., filed Dec. 30, 2013, and U.S. patent application Ser. No. 14/101,051, entitled "Optical Waveguide and Lamp Including Same" by Zongjie Yuan et al., filed Dec. 9, 2013, incorporated by reference herein and owned by the assignee of the present application may be used in the devices disclosed herein. Thus, for example, any of the waveguides or luminaires disclosed herein may include one or more coupling features, one or more light redirection features, one or more coupling features or optics, a modified LED arrangement, one or more extraction features, and/or particular waveguide or overall luminaire shapes and/or configurations as disclosed in such applications, as necessary or desirable. Other luminaire and waveguide form factors than those disclosed herein are also contemplated.

The coupling features disclosed herein efficiently couple light into the waveguide, and the redirection features uniformly mix light within the waveguide and the light is thus conditioned for uniform extraction out of the waveguide. At least some of the luminaires disclosed herein are particularly adapted for use in installations, such as, replacement or retrofit lamps (e.g., LED PAR bulbs), outdoor products (e.g., streetlights, high-bay lights, canopy lights), and indoor products (e.g., downlights, troffers, a lay-in or drop-in application, a surface mount application onto a wall or ceiling, etc.) preferably requiring a total luminaire output of at least about 800 lumens or greater, and, more preferably, a total luminaire output of at least about 3000 lumens, and most preferably a total lumen output of about 10,000 lumens. Further, the luminaires disclosed herein preferably have a color temperature of between about 2500 degrees Kelvin and about 6200 degrees Kelvin, and more preferably between about 2500 degrees Kelvin and about 5000 degrees Kelvin, and most preferably about 2700 degrees Kelvin. Also, at least some of the luminaires disclosed herein preferably exhibit an efficacy of at least about 100 lumens per watt, and more preferably at least about 120 lumens per watt, and further exhibit a coupling efficiency of at least about 92 percent. Further, at least some of the luminaires disclosed herein preferably exhibit an overall efficiency (i.e., light extracted out of the waveguide divided by light injected into the waveguide) of at least about 85 percent. A color rendition index (CRI) of at least about 80 is preferably attained by at least some of the luminaires disclosed herein, with a CRI of at least about 88 being more preferable. A gamut area index (GAI) of at least about 65 is achievable as is a thermal loss of less than about 10%. Any desired form factor and particular output light distribution, such as a butterfly light distribution, could be achieved, including up and down light distributions or up only or down only distributions, etc.

When one uses a relatively small light source which emits into a broad (e.g., Lambertian) angular distribution (common for LED-based light sources), the conservation of etendue, as generally understood in the art, requires an optical system having a large emission area to achieve a narrow (collimated) angular light distribution. In the case of parabolic reflectors, a large optic is thus generally required to achieve high levels of collimation. In order to achieve a large emission area in a more compact design, the prior art has relied on the use of Fresnel lenses, which utilize refractive optical surfaces to direct and collimate the light. Fresnel lenses, however, are generally planar in nature, and are therefore not well suited to re-directing high-angle light emitted by the source, leading to a loss in optical efficiency. In contrast, in the present invention, light is coupled into the optic, where primarily TIR is used for re-direction and collimation. This coupling allows the full range of angular emission from the source, including high-angle light, to be re-directed and collimated, resulting in higher optical efficiency in a more compact form factor.

Embodiments disclosed herein are capable of complying with improved operational standards as compared to the prior art as follows:

|  | State of the art standards | Improved Standards Achievable by Present Embodiments |
| --- | --- | --- |
| Input coupling efficiency (coupling + waveguide) | 90% | About 95% plus improvements through color mixing, source mixing, and control within the waveguide |
| Output efficiency (extraction) | 90% | About 95%: improved through extraction efficiency plus controlled distribution of light from the waveguide |
| Total system | ~80% | About 90%: great control, many choices of output distribution |

In at least some of the present embodiments the distribution and direction of light within the waveguide is better known, and hence, light is controlled and extracted in a more controlled fashion. In standard optical waveguides, light bounces back and forth through the waveguide. In the present embodiments, light is extracted as much as possible over one pass through the waveguide to minimize losses.

In some embodiments, one may wish to control the light rays such that at least some of the rays are collimated, but in the same or other embodiments, one may also wish to control other or all of the light rays to increase the angular dispersion thereof so that such light is not collimated. In some embodiments, one might wish to collimate to narrow ranges, while in other cases, one might wish to undertake the opposite.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. Preferred embodiments of this disclosure are described herein, including the best mode known to the inventors for carrying out the disclosure. It should be understood that the illustrated embodiments are exemplary only, and should not be taken as limiting the scope of the disclosure.

We claim:

1. An LED package, comprising:
   a plurality of LEDs; and
   a primary optic disposed adjacent the LEDs, wherein the primary optic comprises protrusions for mixing light developed by the plurality of LEDs;
   wherein the primary optic directs light into a secondary optic disposed around the primary optic; and
   wherein the protrusions form ridges separated by intervening grooves and an apex portion is disposed inside the ridges and grooves wherein the ridges and the apex portion are one of a same size and different sizes.

2. The LED package of claim 1, wherein the primary optic is symmetric in overall shape.

3. The LED package of claim 1, wherein the primary optic is asymmetric in overall shape.

4. The LED package of claim 1, wherein the primary optic comprises a shape comprising one of a round shape, a substantially square shape with rounded corners, and a D-shape.

5. The LED package of claim 1, wherein the ridges are all of a first size and the grooves are disposed between the ridges and the grooves are all of a second size.

6. The LED package of claim 5, wherein the ridges and grooves extend from an outer edge to a central portion.

7. The LED package of claim 6, wherein at least some of the ridges have one of a continuous shape and a discontinuous shape.

8. The LED package of claim 6, wherein the ridges comprise at least one of a curved portion and a straight portion.

9. The LED package of claim 1, wherein the protrusions are regularly spaced.

10. An LED package, comprising:
    a plurality of multicolor LEDs; and
    a primary optic disposed adjacent the LEDs, wherein the primary optic comprises at least one feature that mixes light developed by the plurality of multicolor LEDs wherein the at least one feature comprises at least one of a positive inflection and a negative inflection;
    wherein the primary optic is disposed within a coupling cavity of a secondary optic;
    wherein the at least one feature defines ridges separated from one another by grooves; and
    wherein the ridges and grooves are disposed about an apex portion.

11. The LED package of claim 10, wherein the at least one feature comprises another at least one of a protrusion, a depression, a ridge, and a groove.

12. The LED package of claim 10, wherein the ridges and grooves terminate at a central portion.

13. The LED package of claim 12, wherein the ridges and grooves are circumferential and further wherein the apex portion is disposed at the central portion.

14. The LED package of claim 10, wherein the ridges and grooves extend from an outer edge to a central portion.

15. The LED package of claim 10, wherein the features define one of continuous ridges, discontinuous ridges, a curved ridge, a straight ridge, regularly spaced ridges, and irregularly spaced ridges.

16. A luminaire, comprising:
    a waveguide body comprising a coupling cavity, a plug member comprising a first portion disposed in the coupling cavity and comprising an outer surface substantially conforming to the coupling cavity and a second portion extending from the first portion into the coupling cavity and comprising a reflective surface adapted to direct light in the coupling cavity into the waveguide body, and a plurality of extraction features; and
    LED elements disposed in the coupling cavity comprising at least one LED of a first spectral emission characteristic and at least one LED of a second different spectral emission characteristic; and
    a primary lens adjacent the LED elements comprising at least one feature that mixes light produced thereby.

17. The luminaire of claim 16, wherein the at least one feature defines at least one of a protrusion, a depression, a ridge, a groove, continuous ridges, discontinuous ridges, a curved ridge, a straight ridge, regularly spaced ridges, and irregularly spaced ridges.

18. The luminaire of claim 16, wherein the at least one feature defines circumferential ridges and grooves and further comprising an apex portion disposed inside the ridges and grooves.

19. The LED package of claim 16, wherein the at least one feature defines ridges and grooves extending from an outer edge to a central portion.

* * * * *